United States Patent
Kawahito

(10) Patent No.: US 8,537,218 B2
(45) Date of Patent: Sep. 17, 2013

(54) DISTANCE IMAGE SENSOR AND METHOD FOR GENERATING IMAGE SIGNAL BY TIME-OF-FLIGHT METHOD

(75) Inventor: Shoji Kawahito, Hamamatsu (JP)

(73) Assignee: National University Corporation Shizuoka University (JP)

( * ) Notice: Subject to any disclaimer, the term of this patent is extended or adjusted under 35 U.S.C. 154(b) by 343 days.

(21) Appl. No.: 13/056,697

(22) PCT Filed: Jul. 30, 2009

(86) PCT No.: PCT/JP2009/063582
§ 371 (c)(1),
(2), (4) Date: Mar. 15, 2011

(87) PCT Pub. No.: WO2010/013779
PCT Pub. Date: Feb. 4, 2010

(65) Prior Publication Data
US 2011/0157354 A1    Jun. 30, 2011

(30) Foreign Application Priority Data

Jul. 30, 2008  (JP) ................................ 2008-196616

(51) Int. Cl.
*H04N 7/18* (2006.01)
(52) U.S. Cl.
USPC ...................................................... 348/140
(58) Field of Classification Search
USPC ......................................... 348/140; 356/5.01
See application file for complete search history.

(56) References Cited

U.S. PATENT DOCUMENTS

| 5,856,667 | A | 1/1999 | Spirig et al. |
| 5,986,297 | A | 11/1999 | Guidash et al. |

(Continued)

FOREIGN PATENT DOCUMENTS

| JP | H9-178853 | 7/1997 |
| JP | 11-177076 | 7/1999 |

(Continued)

OTHER PUBLICATIONS

European Search Report issued Dec. 28, 2011 in connection with corresponding European Patent Application No. 09803021.6.

(Continued)

*Primary Examiner* — Christopher S Kelley
*Assistant Examiner* — Zhen Jessica Li
(74) *Attorney, Agent, or Firm* — Ostrolenk Faber LLP

(57) ABSTRACT

A distance image sensor capable of enlarging the distance measurement range without reducing the distance resolution is provided. A radiation source 13 provides first to fifth pulse trains $P_{T1}$ to $P_{T5}$ which are irradiated to the object as radiation pulses in the first to fifth frames arranged in order on a time axis. In each of the frames, imaging times $T_{PU1}$ to $T_{PU5}$ are prescribed at points of predetermined time $\Delta T_{PD}$ from the start point of each frame, also the pulses $P_{T1}$ to $P_{T5}$ are shifted respectively by shift amounts different from each other from the start point of the first to fifth frames. A pixel array 23 generates element image signals $S_{E1}$ to $S_{E5}$ each of which has distance information of an object in distance ranges different from each other using imaging windows A and B in each of five frames. A processing unit 17 generates an image signal $S_{IMAGE}$ by combining the element image signals. Since five times-of-flight measurement are used, the width of the radiation pulse does not have to be increased to obtain distance information of the object in a wide distance range, and the distance resolution is not reduced.

12 Claims, 17 Drawing Sheets

(56) References Cited

U.S. PATENT DOCUMENTS

| | | | |
|---|---|---|---|
| 6,323,942 B1 | 11/2001 | Bamji | |
| 2002/0149694 A1* | 10/2002 | Seo | 348/370 |
| 2004/0233416 A1* | 11/2004 | Doemens et al. | 356/5.01 |

FOREIGN PATENT DOCUMENTS

| | | |
|---|---|---|
| JP | 2000-504489 | 4/2000 |
| JP | 2004-538491 | 12/2004 |
| JP | 2005-235893 | 9/2005 |
| WO | 97/28558 | 8/1997 |
| WO | 2005/076037 | 8/2005 |
| WO | 2007/026779 | 3/2007 |
| WO | 2008/152647 | 12/2008 |

OTHER PUBLICATIONS

Kawahito, Shoji, et al., "A CMOS Time-of-Flight Range Image Sensor With Gates-on-Field-Oxide Structure," IEEE Sensors Journal, IEEE Service Center, New York, NY, vol. 7, No. 12, pp. 1578-1586 (Dec. 2007).

Stoppa, David, et al., "A 16×16-Pixel Range-Finding CMOS Image Sensor," Solid-State Circuits Conference , 2004. ESSCIRC 2004. Proceeding of the 30th European, IEEE, Piscataway, NJ, pp. 419-422, (Sep. 21, 2004).

Sawada, Tomonari, et al. "TOF Range Image Sensor Using a Range-Shift Technique," 2008 IEEE Sensors, LECCE Italy, IEEE, Piscataway, NJ, pp. 1390-1393, (Oct. 26, 2008).

English language translation of International Preliminary Report on Patentability issued Apr. 14, 2011.

International Search Report issued Oct. 13, 2009.

Miyagawa, Ryohei et al., "CCD-based range finding sensor," IEEE Trans. Electron Devices, vol. 44, No. 10, pp. 1648-1652, (1997).

Office Action dated Aug. 6, 2013 in corresponding JP Appln. No. P2008-196616 with partial translation.

\* cited by examiner

Fig.2
(a)
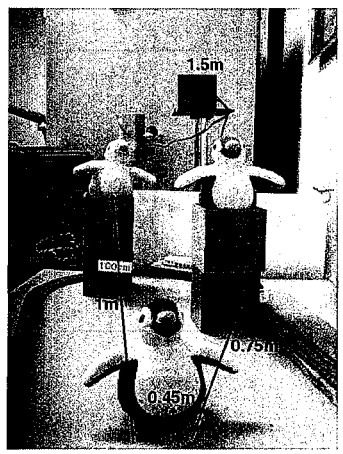
(b)
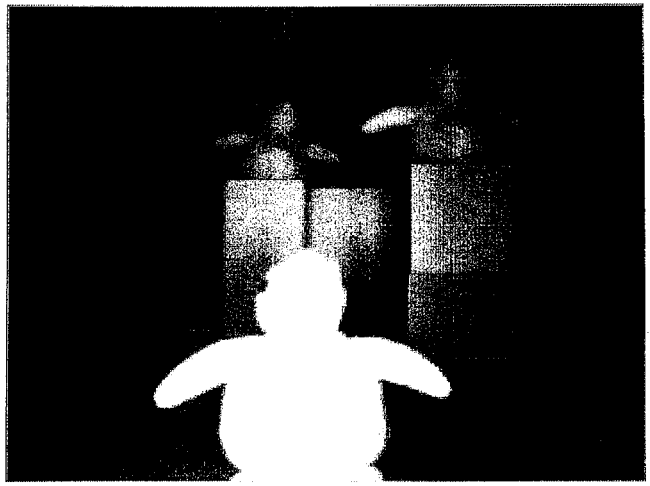
(c)
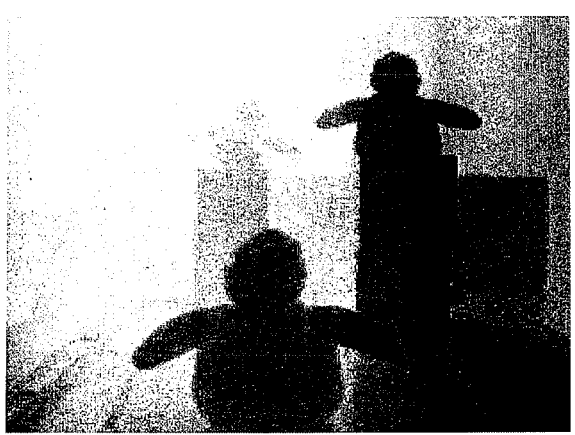
4.0m
2.0m
0.2m

Fig.7
(a)
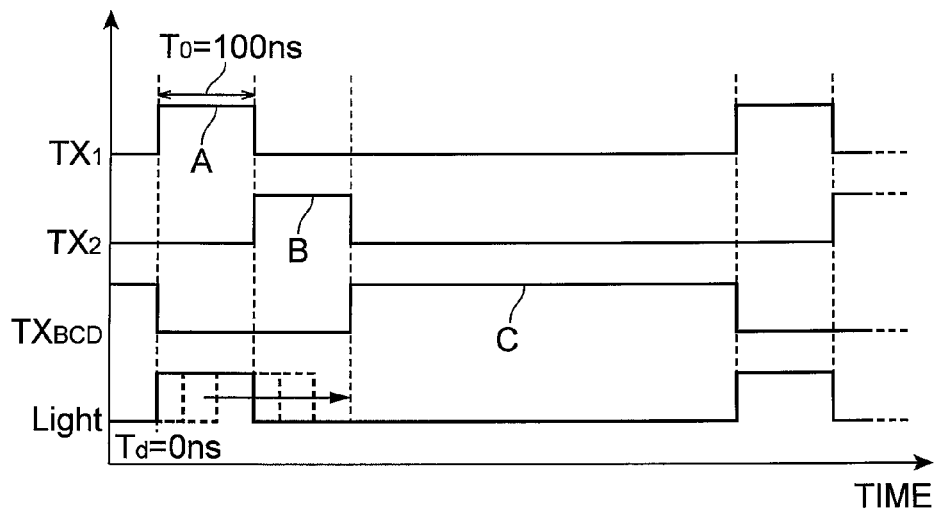
(b)
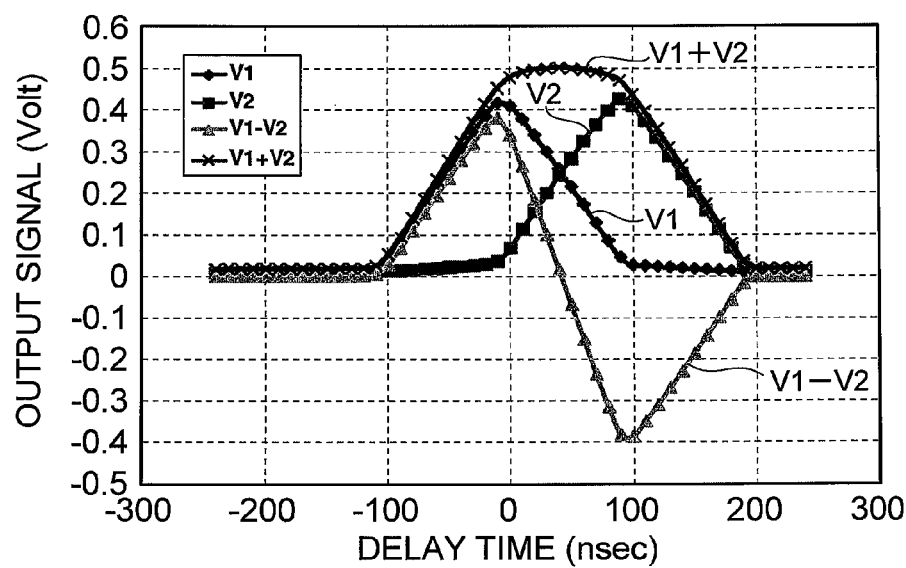

*Fig.8*
(a)
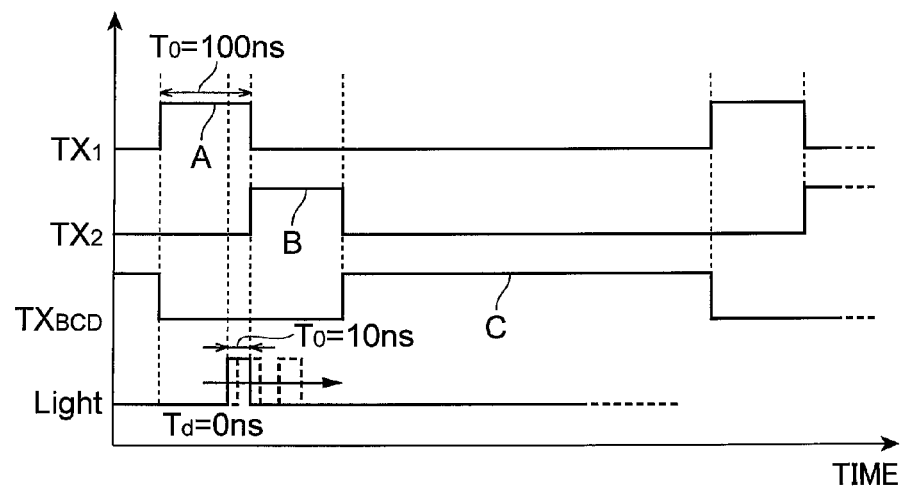
(b)
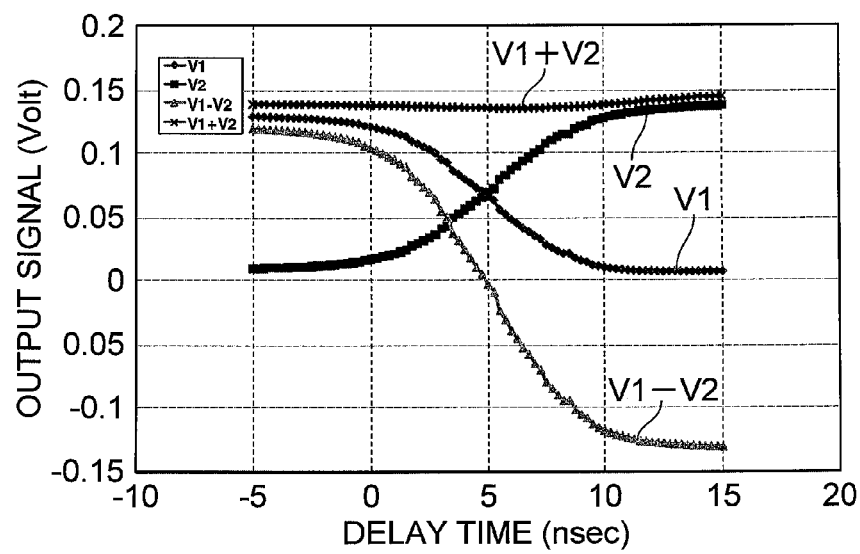

*Fig.9*
(a)
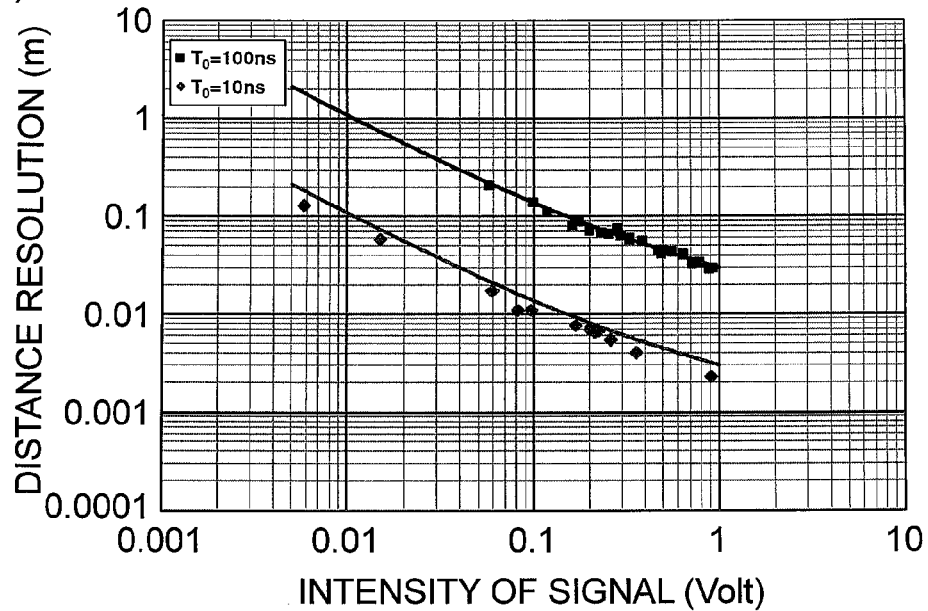
(b)
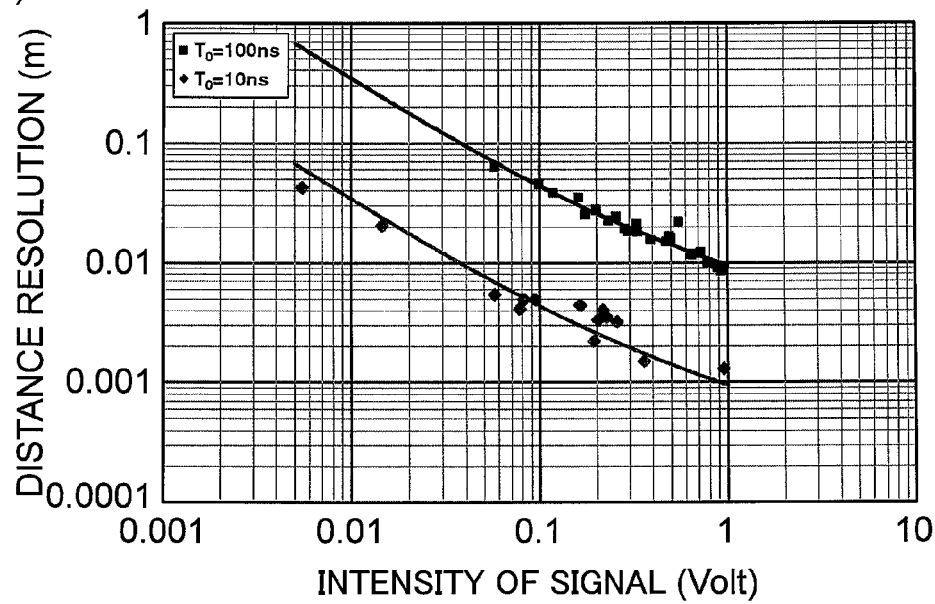

Fig.12
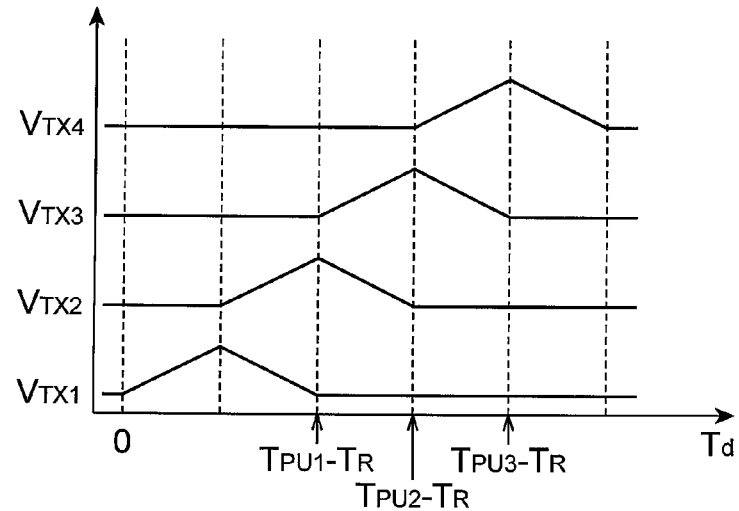
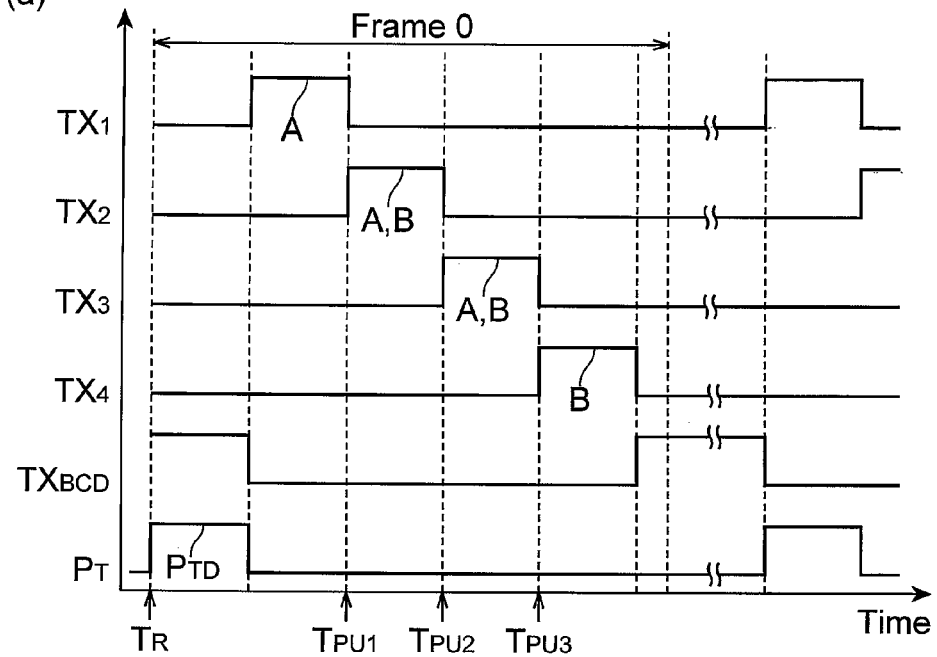

*Fig.15*
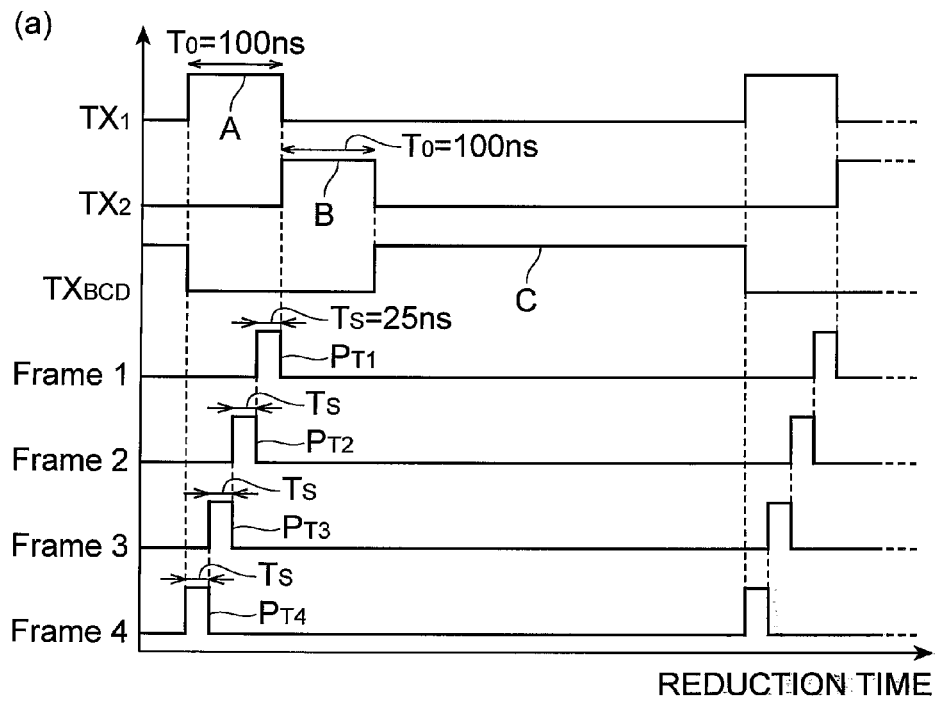
(a)
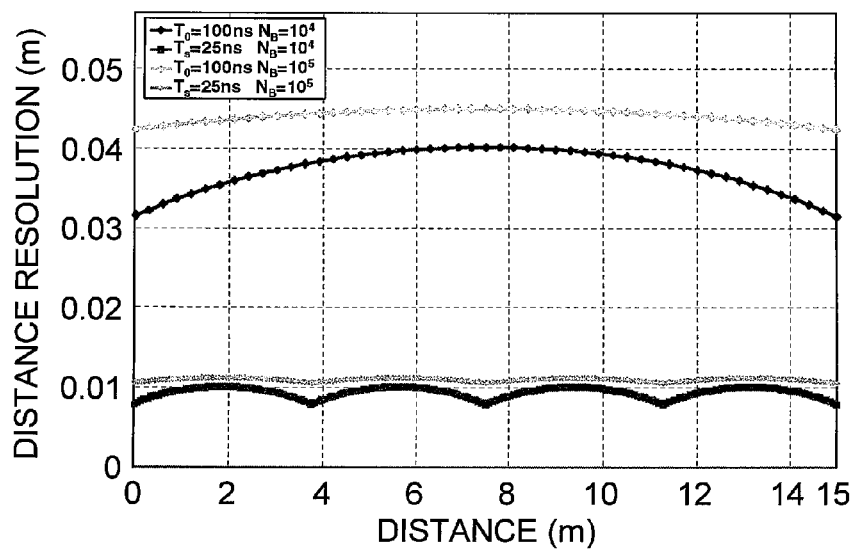
(b)

Fig.16
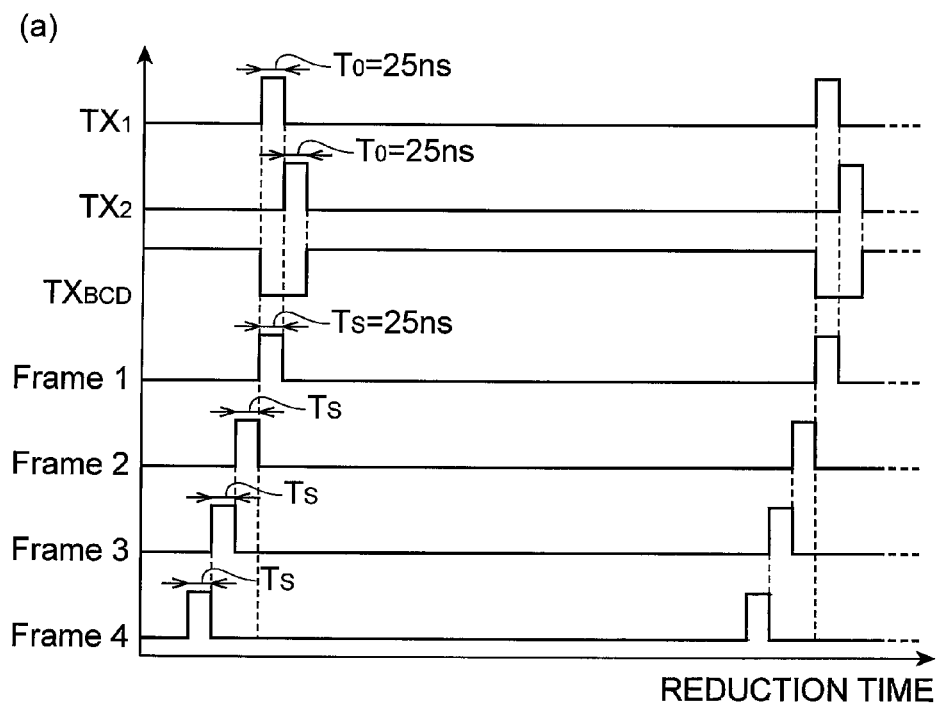
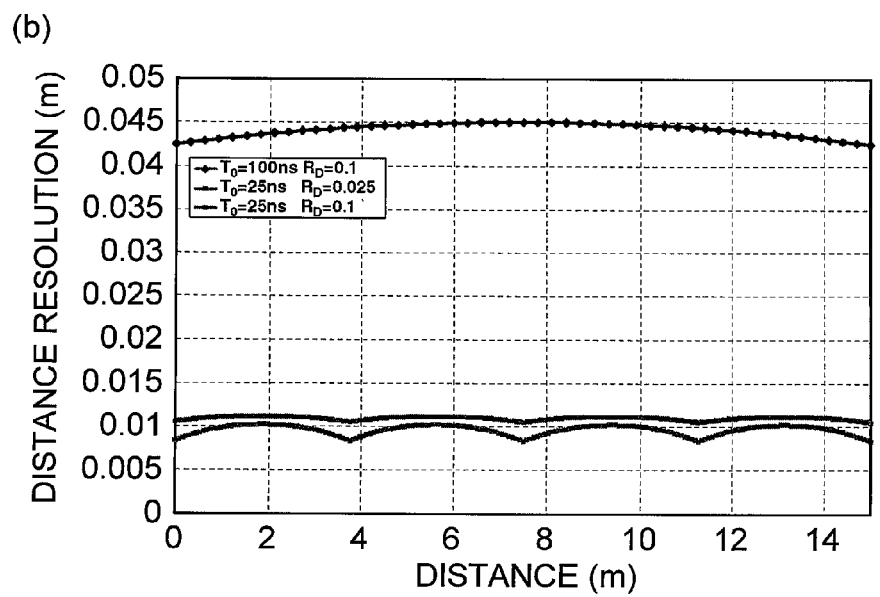

Fig.17
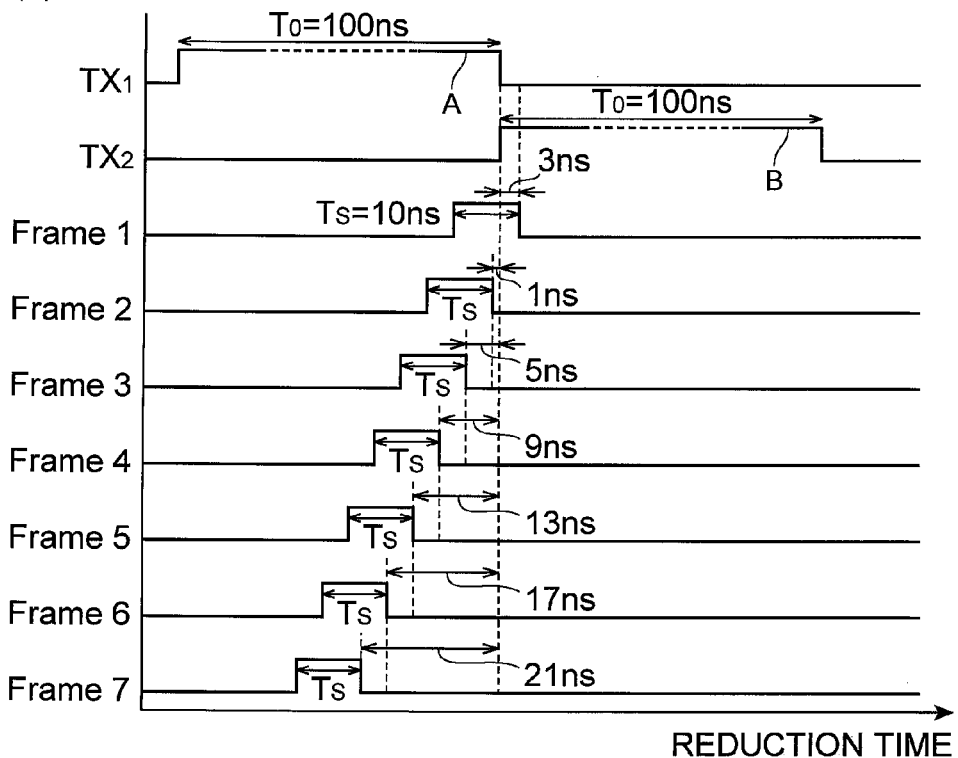
(a)
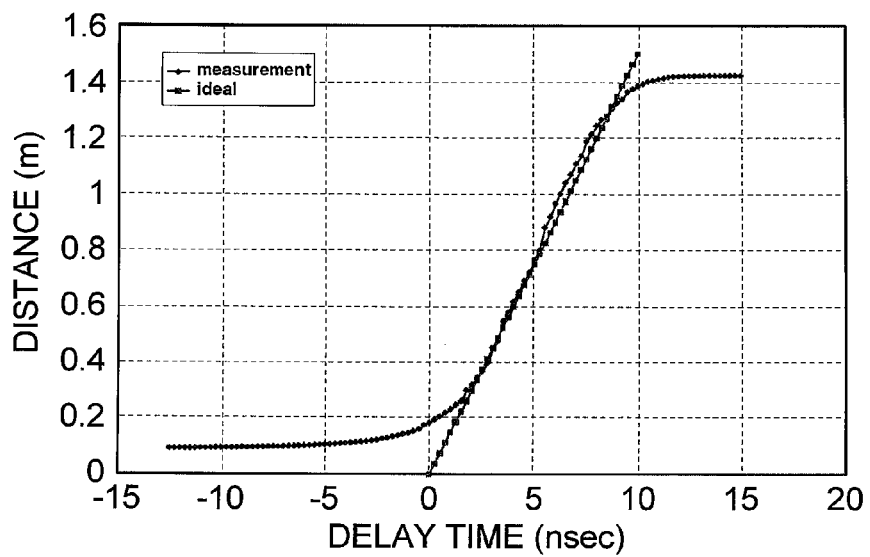
(b)

DISTANCE IMAGE SENSOR AND METHOD FOR GENERATING IMAGE SIGNAL BY TIME-OF-FLIGHT METHOD

CROSS REFERENCE TO RELATED APPLICATIONS

The present application is a 35 U.S.C. §371 national phase conversion of PCT/JP2009/063582 filed Jul. 30, 2009 and claims priority of JP2008-196616 filed Jul. 30, 2008, both incorporated herein in their entirety.

TECHNICAL FIELD

The present invention relates to distance image sensors and method for generating image signals by time-of-flight method.

BACKGROUND ART

Patent literature 1 describes a solid state imaging device capable of performing simultaneous electronic shutter operation on all pixels. The solid state imaging device closes the 1st transfer gates all together after resetting every photodiodes to accumulate the electric charge on each of the photodiodes. After a certain shutter time has elapsed, the 1st transfer gates are opened all together to transfer the accumulated electric charge to respective charge accumulation areas. Patent literature 2 describes an active pixel sensor array which performs electronic shutter operation. Patent literature 3 describes a pixel circuit for distance image sensors, in which an oxide film is formed on a silicon substrate, and two photo gate electrodes for transferring the charge are provided on the oxide film. In an edge area of the oxide film, a floating diffusion layer is provided for taking out the charge. Patent literature 4 describes a method and device for detecting and demodulating intensity-modulated radiation field. The method and device controls an electronic switch for sensor element so as to transfer signal charge, which is generated by a photo sensitive portion of a sensor element array, to memory cell in sync with the modulated signal, which is generated by a light source, as well as controlling the memory cell so as to transfer the signal charge stored in the memory cell to an evaluation unit. Patent literature 5 describes an active pixel sensor. The active pixel sensor has: a photodetection area which generates photocharge, which is collected as signal charge, from the input light; and a transistor which transfers the signal charge from the photodetection area to a sense node connected to an input of an amplifier within the pixel. The pixel is designed so that the photodetection area has a two-dimensional symmetry with respect to a central axis thereof. Patent literature 6 describes a three-dimensional imaging system which uses TOF method. Each pixel of the three-dimensional imaging system includes a pixel detector, a charge collector and an electronic shutter; the electronic shutter is disposed between the pixel detector and the charge collector. Non patent literature 1 describes a distance measuring sensor using a CCD. Delayed time of reflected light is measured as a phase shift amount between two detection periods.

CITATION LIST

Patent Literature patent literature 1: Japanese Patent Application Laid-open No. 11-177076 patent literature 2: Japanese Translated National Publication of Patent Application No. 2000-504489
patent literature 3: Japanese Patent Application Laid-open No. 2005-235893
patent literature 4: U.S. Pat. No. 5,856,667
patent literature 5: U.S. Pat. No. 5,986,297
patent literature 6: U.S. Pat. No. 6,323,942

Non Patent Literature

Non patent literature 1: Ryohei Miyagawa, Takeo Kanade, "CCD-based range-finding sensor," IEEE Trans. Electron Devices, vol. 44, no. 10, pp. 1648-1652 (1997).

SUMMARY OF INVENTION

Technical Problem

In conventional distance image sensors using time-of-flight of light, to increase the distance measurement range, the following requirements has to be satisfied: i.e. (a1) increasing the modulation frequency of light; (a2) increasing the pulse width of light. Contrarily, to enhance the distance resolution, the following requirements has to be satisfied: i.e. (b1) increasing the modulation frequency of light; (b2) decreasing the pulse width of light. Thus, to increase the distance measurement range, the pulse width of light has to be increased, while to enhance the distance resolution, the pulse width of light has to be decreased. Therefore, increasing the measurable distance range and enhancing the distance resolution are in a relationship of trade-off.

The present invention has been made in view of the above circumstances, and has an object to provide a distance image sensor and method for generating image signal by time-of-flight method capable of increasing the distance measurement range without reducing the distance resolution.

Solution to Problem

An aspect of the invention is a distance image sensor using time-of-flight method. The distance image sensor includes (a) a radiation source that generates radiation pulses to irradiate an object for measuring time-of-flight; (b) an image generating unit including a controller that generates control signals indicating 1st to n-th imaging timings corresponding to 1st to n-th times-of-flight (n>1) different from each other, a pixel array of a plurality of pixels including a detection element for sensing incident radiation to generate electric charge, and a signal generator that generates 1st to n-th element image signals corresponding respectively to the 1st to n-th imaging timings responding to the control signals; and (c) a processing unit that combines the 1st to n-th element image signals to generate an image signal including distance information concerning the object. The detection element of each pixel generates 1st and 2nd electric charges respectively responding to an incident radiation that enters the detection element in 1st and 2nd imaging windows at each of the 1st to n-th imaging timings. Each pixel provides 1st and 2nd element signals from the 1st and 2nd electric charges corresponding respectively to the 1st and 2nd imaging windows. The 1st imaging window, set immediately before imaging time prescribed from a reference time, has a predetermined duration. The 2nd imaging window, set immediately after the imaging time, has a predetermined duration. The i-th element image signal ($1 \leq i \leq n$) includes the 1st and 2nd element signals of each pixel at the i-th imaging timing.

According to the distance image sensor, since the 1st to n-th times-of-flight (n>1) are different from each other, each of the times-of-flight covers distance measurement ranges which are different from each other. Also, since the 1st to n-th element image signals are generated at the 1st to n-th imaging timings corresponding to the 1st to n-th times-of-flight, each of the 1st to n-th element image signals has distance information of the object within the distance ranges different from each other. Since the image signal is generated by combining these 1st to n-th element image signals, distance information of the object in a wide distance range can be obtained.

Also, in order to obtain the distance information of the object, at each of the 1st to n-th imaging timings, since the 1st and 2nd element signals corresponding to the incident radiation entering the detection element of the pixel are generated in the 1st and 2nd imaging windows, the distance range information concerning the object in a wide distance range is obtained by plural times of measurements by time-of-flight method. Therefore, the width of the radiation pulses does not have to be increased to obtain distance information of the object in a wide distance range. Therefore, the distance resolution is not reduced in each time-of-flight measurement.

In the distance image sensor according to the invention, the radiation source provides 1st to n-th pulse trains as the radiation pulses to be irradiated to the object in each of the 1st to n-th frames arranged in order with respect to a time axis. The 1st to n-th pulses are shifted respectively by shift amounts different from each other from the start point of the 1st to n-th frames. In each of the 1st to n-th frames, the imaging time is prescribed at predetermined time from the start point of each frame. Each of the 1st to n-th frames includes the 1st and 2nd imaging windows. The duration of each of the 1st to n-th pulses is not more than the period of the 1st imaging window. The duration of each of the 1st to n-th pulses is not more than the period of the 2nd imaging window.

According to the distance image sensor, for measurement of 1st to n-th times-of-flight, the 1st to n-th pulses, which are shifted by shift amounts different from each other, are used. The 1st to n-th pulses are irradiated to the object in the 1st to n-th frames which are arranged in order with respect to the time axis. Plural times of time-of-flight measurement can be performed by associating the 1st to n-th pulses with the 1st and 2nd imaging windows in the 1st to n-th frames, respectively.

In the distance image sensor according to the invention, each of the 1st to n-th frames includes the 1st and 2nd imaging windows and a charge discarding window different from the 1st and 2nd imaging windows, and the pixel discards electric charge of the detection element in the charge discarding window. According to the distance image sensor, since the electric charge of the detection element is discarded in the charge discard window, background noises affecting the detection element can be removed.

In the distance image sensor according to the invention, the pixel includes 1st and 2nd transfer gates each of which is turned on in the 1st and 2nd imaging windows at the 1st to n-th imaging timings and connected to the detection element, and 1st and 2nd discard gates which are connected to the detection element and turned on in the charge discarding window. The detection element is located between the 1st transfer gate and the 2nd transfer gate. The detection element is located between the 1st discard gate and the 2nd discard gate. The pixel array of the distance image sensor may include an array of pixels having above structure.

In the distance image sensor according to the invention, the pulse width of the 1st to n-th pulses is prescribed so as to generate an image signal including the distance information using a linear response area. According to the distance image sensor, since the linear response area is used, distance accuracy can be ensured in full range of the time-of-flight measurement.

In the distance image sensor according to the invention, the radiation source provides a single pulse to a single frame as the radiation pulse. The 1st to n-th imaging timings are set within the single frame. The imaging times of the 1st to n-th imaging timings are shifted from the start point of the single frame by shift amounts different from each other. The 1st imaging window is provided immediately before the imaging time of the 1st imaging timing, and the 2nd imaging window is provided immediately after the imaging time of the n-th imaging timing. Between the i-th imaging timing ($1 \leq i < n-1$) and the (i+1)-th imaging timing among the 1st to n-th imaging timings, a window for taking in electric charge corresponding to an incident radiation entering the detection element is prescribed. The window is used for both of the 1st and 2nd imaging windows. The duration of the single pulse is not more than the period of the 1st and 2nd imaging windows.

According to the distance image sensor, 1st and 2nd imaging windows are provided respectively before and after the imaging time at each of the 1st to n-th imaging timings. Therefore, the 1st and a plurality of the 2nd imaging windows are arranged alternately to configure a row of imaging windows. At the top of the row of imaging windows, a single 1st imaging window is set, and a single 2nd imaging window is set at the last thereof. In the row of imaging windows, one or a plurality of common imaging windows are set between the single 1st imaging window and the single 2nd imaging window. The common imaging windows are provided for both of the 1st imaging window and the 2nd imaging window. The 1st to n-th element image signals are generated at n imaging times in the row of imaging windows.

In the distance image sensor according to the invention, the single frame includes the 1st and 2nd imaging windows and a charge discarding window different from the 1st imaging window and the 2nd imaging window. The pixel discards electric charge of the detection element in the charge discarding window. According to the distance image sensor, since the electric charge of the detection element is discarded in the charge discarding window, background noises affecting the detection element can be removed.

In the distance image sensor according to the invention, the pixel includes 1st to j-th transfer gates in a 1st group disposed at one side of the detection element, (j+1)-th to (n+1)-th transfer gates in a 2nd group disposed at the other side of the detection element, and 1st and 2nd discard gates which are connected to the detection element and turned on in the charge discarding window. The 1st to (n+1)-th transfer gates are turned on at any of the 1st to n-th imaging timings. The detection element is located between the 1st discard gate and the 2nd discard gate. The pixel array of the distance image sensor may include an array of pixels having the above structure.

Another aspect of the invention is a method for generating image signals including distance information concerning an object by time-of-flight method using a pixel array including a plurality of pixels and a radiation source for measuring time-of-flight. The method includes (a) a step of generating 1st to n-th element image signals by carrying out a plurality of imagings at 1st to n-th times-of-flight (n>1) different from each other using a detection element of the pixel array; and (b) a step of generating an image signal including distance information concerning the object by combining the 1st to n-th element image signals. Each pixel generates 1st and 2nd electric charges in 1st and 2nd imaging windows at the 1st to n-th imaging timings, respectively. The 1st imaging window, set immediately before imaging time prescribed from a reference time, has a predetermined duration. The 2nd imaging window, set immediately after the imaging time, has a predetermined duration. Each pixel provides 1st and 2nd element signals corresponding respectively to the amounts of the 1st and 2nd electric charges. The i-th element image signal ($1 \leq i \leq n$) includes the 1st and 2nd element signals of the plurality of pixels at the i-th imaging timing.

According to the method, since the 1st to n-th times-of-flight (n>1) are different from each other, each of the times-of-flight covers distance measurement ranges different from each other. Also, since the 1st to n-th element image signals are generated at 1st to n-th imaging timings corresponding to the 1st to n-th times-of-flight, each of the 1st to n-th element image signals has distance information of the object in distance ranges different from each other. Since the image signal is generated by combining the 1st to n-th element image signals, distance information of the object in a wide distance range can be obtained.

Also, in order to obtain distance information of the object, at each of the 1st to n-th imaging timings, since the 1st and 2nd element signals corresponding to incident radiation that enters the detection element of the pixel are generated in the 1st imaging window and the 2nd imaging window, the distance range information concerning the object is obtained in a wide distance range by plural times-of-flight. Therefore, the width of the radiation pulse does not have to be increased to obtain distance information of the object in a wide distance range. Therefore, in each of the time-of-flight measurements, the distance resolution is not reduced.

In the method according to the invention, the step of generating the 1st to n-th element image signals includes the step of irradiating the object with radiation pulses for measuring the time-of-flight. In the irradiation of the radiation pulses, 1st to n-th pulses for irradiating the object in each of the 1st to n-th frames arranged in order with respect to a time axis are emitted. The 1st to n-th pulses are shifted respectively by shift amounts different from each other from the start point of the 1st to n-th frames. In each of the 1st to n-th frames, the reference time is the start point of each of the frames. Each of the 1st to n-th frames includes the 1st and the 2nd imaging windows. The duration of each of the 1st to n-th pulses is not more than the period of the 1st imaging window. The duration of each of the 1st to n-th pulses is not more than the period of the 2nd imaging window.

According to the method, the 1st to n-th pulses, which are shifted by shift amounts different from each other, are used for measurement of the 1st to n-th times-of-flight. The 1st to n-th pulses are irradiated to the object in the 1st to n-th frames arranged in order with respect to the time axis. Plural times of time-of-flight measurement can be performed by using the 1st to n-th pulses and using the 1st and 2nd imaging windows in the 1st to n-th frames, respectively.

In the method according to the invention, the step of generating the 1st to n-th element image signals includes the step of irradiating the object with radiation pulses for measuring the time-of-flight. Radiation pulses or a single pulse is emitted in a single frame. The 1st to n-th imaging timings are set within the single frame. The 1st to n-th imaging timings are shifted by shift amounts different from each other from the start point of the single frame. Each of the 1st and 2nd imaging windows is provided between the neighboring imaging timings among the 1st to n-th imaging timings.

According to the method, the 1st and 2nd imaging windows are provided before and after the imaging time at each of the 1st to n-th imaging timings. Therefore, a plurality of 1st imaging windows and a plurality of 2nd imaging windows are arranged alternately to configure the row of the imaging windows. At the top of the row of the imaging windows, the single 1st imaging window is set; the single 2nd imaging window is set at the last thereof. In the row of the imaging windows, one or a plurality of common imaging windows are set between the single 1st imaging window and the single 2nd imaging window. The common imaging window is provided for both of the 1st imaging window and the 2nd imaging window.

Advantageous Effects of Invention

According to the invention, a distance image sensor and a method for generating image signal by time-of-flight method capable of increasing distance measurement range without reducing the distance resolution are provided.

BRIEF DESCRIPTION OF DRAWINGS

FIGS. 2(a) to 2(c) are views of an image in which image signal $S_{IMAGE}$ is displayed on a display unit.

FIGS. 7(a) and 7(b) are diagrams representing pixel distribution characteristics.

FIGS. 8(a) and 8(b) are diagrams representing pixel distribution characteristics in which short pulse is used.

FIGS. 9(a) and 9(b) are diagrams representing a relationship between the radiation pulse width and imaging window width and the distance resolution.

FIGS. 12(a) and 12(b) are diagrams representing distance measurement timing using a single frame and waveform of signals which are generated at each of selection gates TX1 to TX4 responding to a delay of pulse.

FIGS. 15(a) and 15(b) are diagrams representing the timings in one example of the distance image sensor.

FIGS. 16(a) and 16(b) are diagrams representing the timings in one example of the distance image sensor.

FIGS. 17(a) and 17(b) are diagrams representing the timings in one example of the distance image sensor.

DESCRIPTION OF EMBODIMENTS

Figure 1:
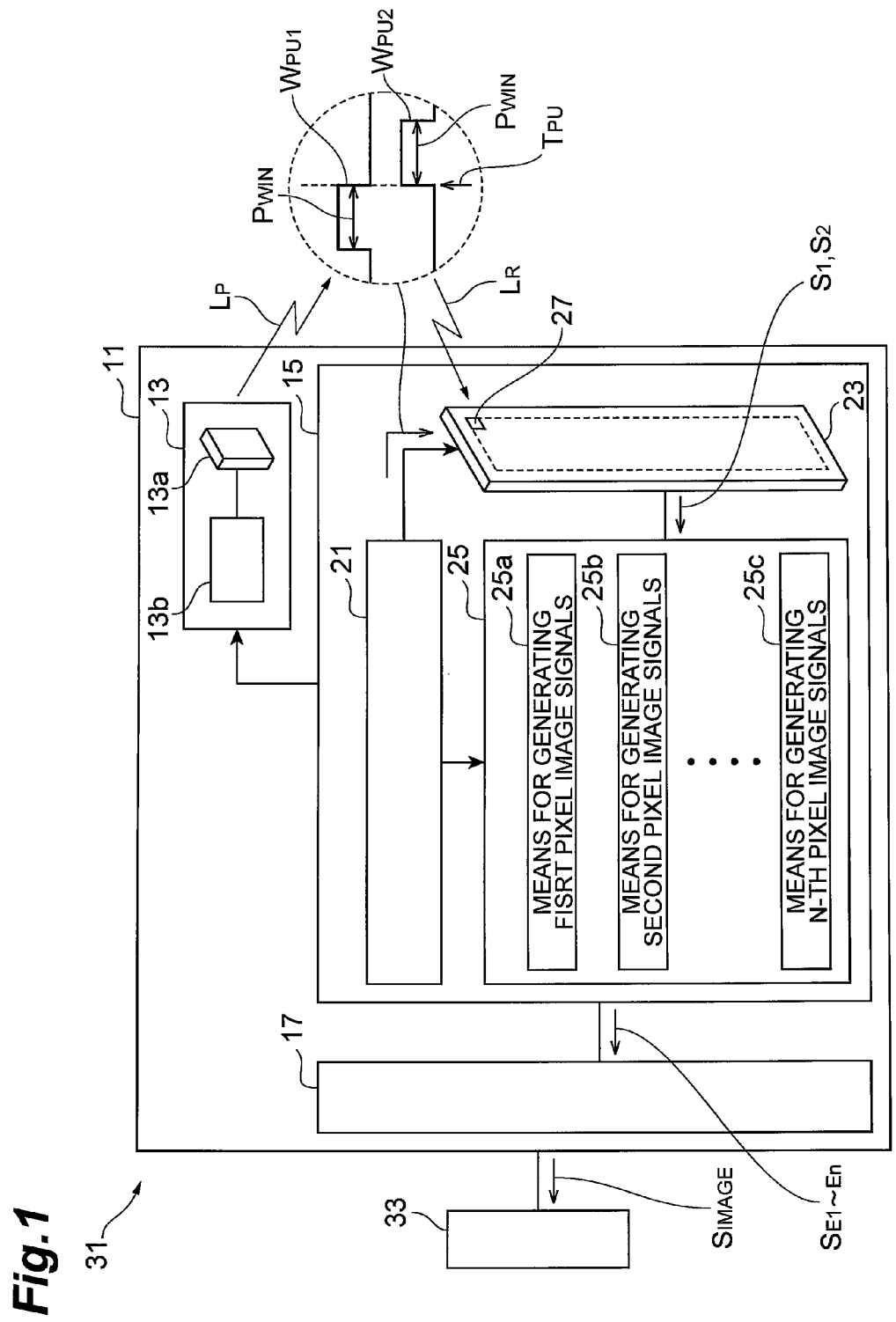
FIG. 1 is a diagram illustrating a distance image sensor by time-of-flight method according to an embodiment.

The knowledge relevant to the invention is easily understood by considering the detailed description below while referring to the accompanying drawings which are given as examples. Now, referring to the accompanying drawings, embodiments of distance image sensors and method for generating image signals by time-of-flight method of the invention will be described. If applicable, the same elements will be given with the same reference numerals and symbols.

FIG. 1 is a diagram illustrating a distance image sensor by using time-of-flight method according to the embodiment. A distance image sensor 11 includes a radiation source 13, an image generating unit 15 and a processing unit 17. In order to measure time-of-flight, the radiation source 13 generates radiation pulses $L_P$ for irradiating an object. The radiation source 13 includes, for example, a semiconductor light-emitting element 13a and a drive circuit 13b for the light-emitting element 13a, and the drive circuit 13b drives the light-emitting element responding to a timing signal. For the semiconductor light-emitting element 13a, a light-emitting diode or a laser diode is used. The radiation source 13 can use radiation within a range of wavelength including near-infrared region, visible light or the like. The light source, which provides near-infrared region light, visible light or the like, emits light pulses for TOF measurement. The image generating unit 15 includes a controller 21, a pixel array 23 and a signal generator 25. The controller 21 of the image generating unit 15 generates a control signal indicating 1st to n-th imaging timings corresponding to 1st to n-th times-of-flight (n>1) TOF1 to TOFn which are different from each other. The pixel array 23 includes a plurality of pixels 27, and the pixels 27 are arranged, for example, in lines and columns. Each of the pixels 27 includes a detection element that senses incident radiation $L_R$ and generates electric charge. For the detection element, for example, a photogate or the like may be employed. The signal generator 17 generates 1st to n-th element image signals $S_{E1}$ to $S_{En}$ corresponding respectively to imagings at 1st to n-th imaging timings responding to the control signal. The processing unit 17 combines the 1st to n-th element image signals $S_{E1}$ to $S_{En}$ to generate an image signal $S_{IMAGE}$ including distance information concerning the object.

The detection element of each of the pixels 27 generates 1st and 2nd electric charges responding to an incident radiation entering the detection element in 1st and 2nd imaging windows $W_{PU1}$ and $W_{PU2}$ at each imaging timing. Each of the pixels 27 provides 1st and 2nd output signals S1 and S2 corresponding respectively to the 1st and 2nd electric charges in the 1st and 2nd imaging windows $W_{PU1}$ and $W_{PU2}$. The 1st imaging window $W_{PU1}$ is set immediately before imaging time $T_{PU}$ prescribed from a reference time, and the 2nd imaging window $W_{PU2}$ is set immediately after the imaging time $T_{PU}$. Therefore, n times of flight (TOF) can be measured based on the ratio between the 1st and 2nd electric charges in n imagings. The 1st and 2nd imaging windows $W_{PU1}$ and $W_{PU2}$ have a predetermined duration $P_{WIN}$. An i-th element image signal ($1 \leq i \leq n$) includes 1st and 2nd element signals S1 and S2 of each pixel 27 at the i-th imaging timing.

According to the distance image sensor 11, since the 1st to n-th times-of-flight TOF1 to TOFn are different from each other, the measurements of the respective times-of-flight TOF1 to TOFn cover distance measurement ranges different from each other. Also, since the 1st to n-th element image signals $S_{E1}$ to $S_{En}$ are generated at 1st to n-th imaging timings corresponding to the 1st to n-th times-of-flight TOF1 to TOFn, each of the 1st to n-th element image signals $S_{E1}$ to $S_{En}$ has distance information of the object in distance ranges different from each other. Since an image signal $S_{IMAGE}$ is generated by combining these 1st to n-th element image signals $S_{E1}$ to $S_{En}$, distance information of the object can be obtained in a wide distance range.

Also, to obtain distance information of the object, at each of the 1st to n-th imaging timings, since 1st and 2nd output signals S1 and S2 responding to the incident radiation $L_R$ entering a detection element of the pixel 27 through the 1st and 2nd imaging windows $W_{PU1}$ and $W_{PU2}$ are generated, information of distance range concerning the object in a desired distance range is obtained by carrying out the measurement of time-of-flight plural times. Since the width of the radiation pulse $L_P$ does not have to be increased to obtain distance information of the object in a wide distance range, the distance resolution is not reduced in the measurement of the times-of-flight TOF1 to TOFn.

FIG. 1 illustrates a distance image sensor system 31. The system 31 includes a distance image sensor 11 and an external unit 33. The external unit 33 may be, for example, a display unit, an output device or the like. The output device is, for example, an interface unit.

The signal generator 25 includes means 25a, 25b and 25c for generating 1st to n-th element image signals $S_{E1}$ to $S_{En}$ from the 1st and 2nd element signals S1 and S2 which are provided by each of the pixels 27. Each of the 1st to n-th element image signals $S_{E1}$ to $S_{En}$ includes image information and distance information of the object which is imaged at 1st to n-th imaging timings. Since the 1st to n-th imaging timings are arranged at predetermined intervals respectively, it becomes possible to perform imaging in a desired distance measurement range using the 1st to n-th imaging timings. On the other hand, the distance resolution is prescribed by each measurement of the 1st to n-th times-of-flight TOF1 to TOFn.

FIGS. 2(a) to 2(c) illustrate an image in which the image signal $S_{IMAGE}$ is displayed on a display unit 33. FIG. 2(a) illustrates an object to be imaged. FIG. 2(b) illustrates a brightness image which is generated by processing the 1st to n-th element image signals $S_{E1}$ to $S_{En}$. FIG. 2(c) illustrates an image in which the image signal $S_{AGE}$ is output on the display unit. On the display in FIG. 2(c), tone displayed is modified in accordance with the distance between the distance image sensor 11 and the object. In an actual system, the displayed image can be color-coded in accordance with the distance between the distance image sensor 11 and the object.

Figure 3:
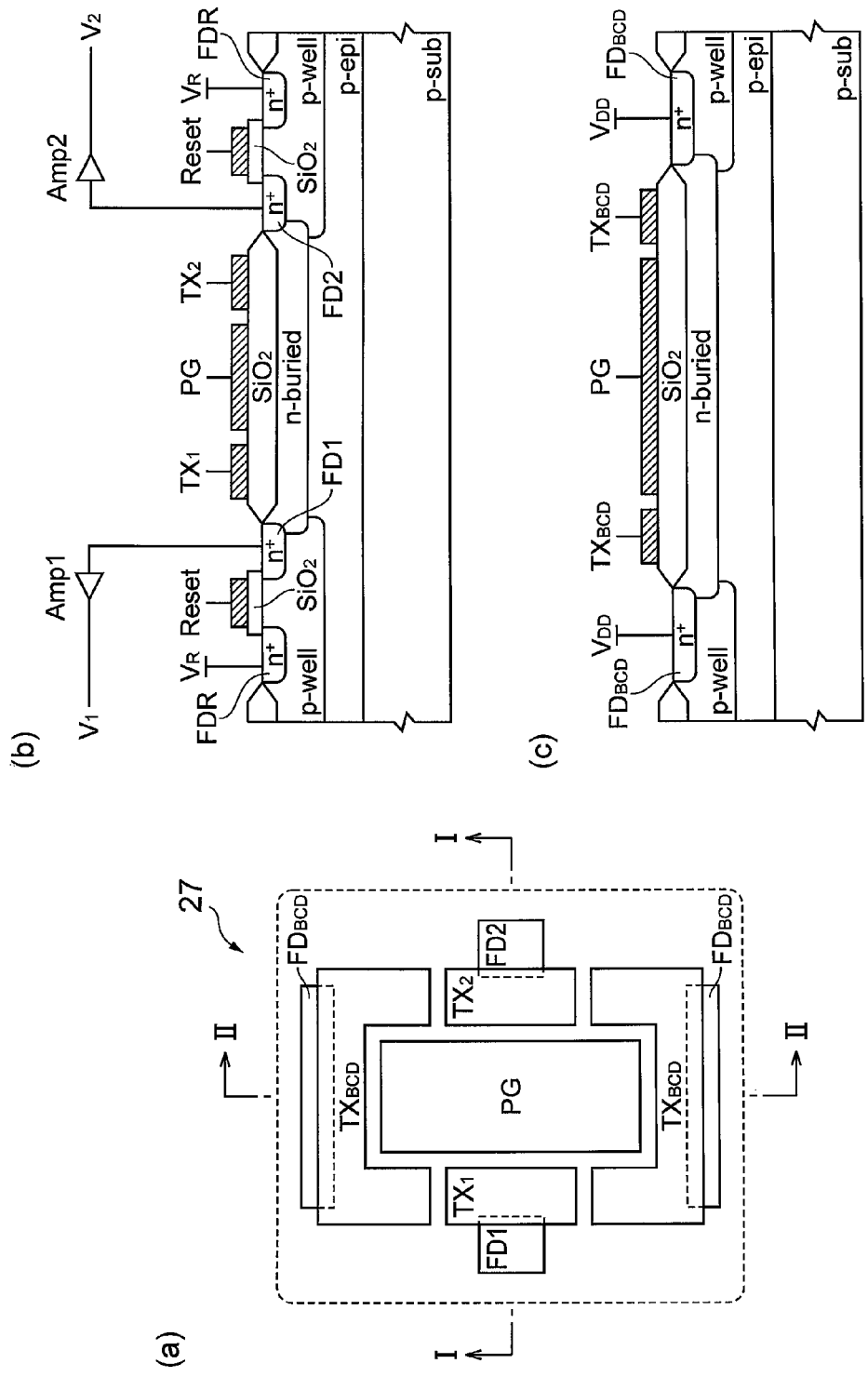
FIGS. 3(a) to 3(c) are diagrams illustrating a pixel structure of a distance image sensor according to the embodiment.
Figure 4:
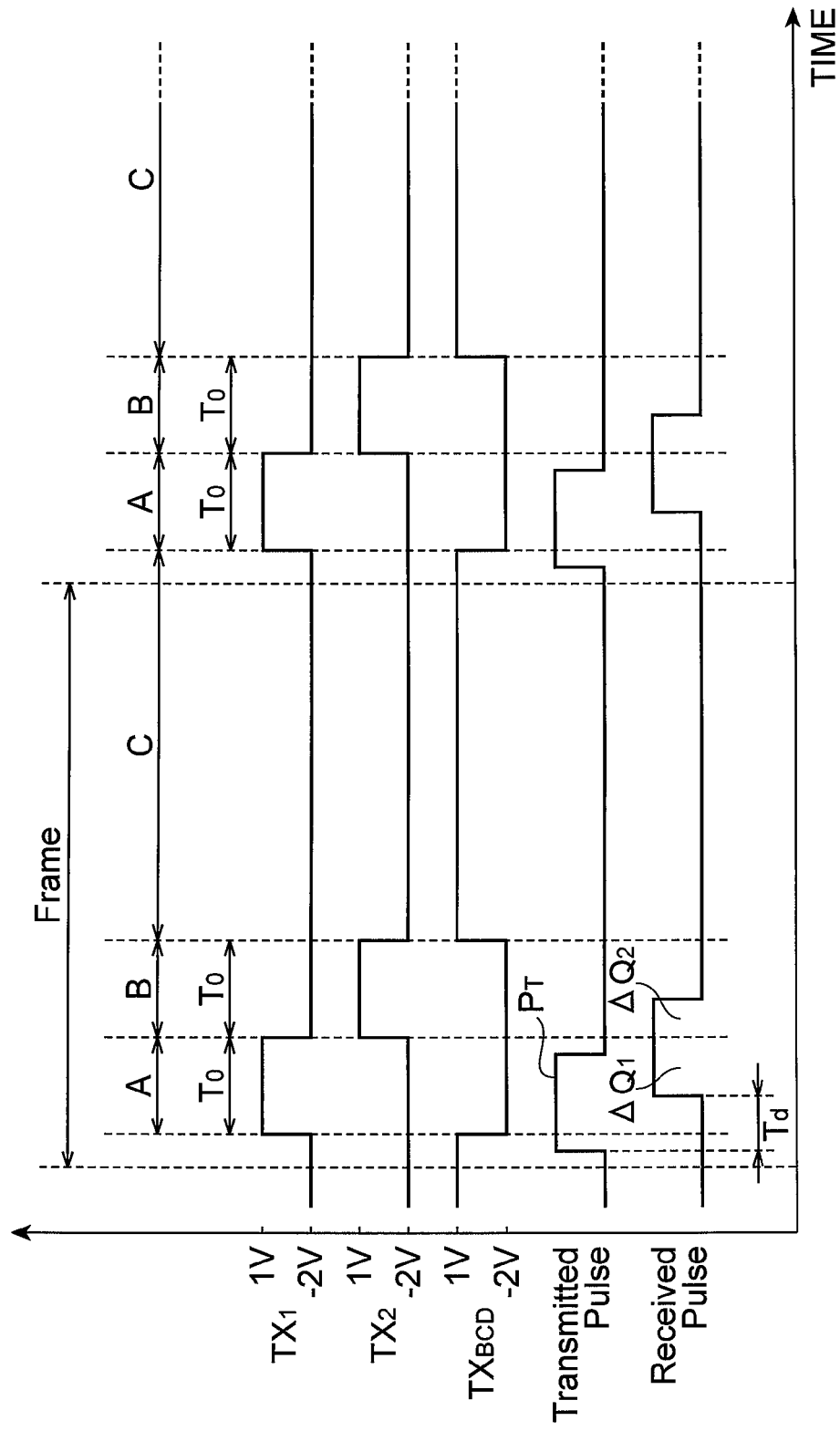
FIG. 4 is a diagram representing operation timing of the pixel.

FIGS. 3(a) to 3(c) illustrate a structure of the pixel for the distance image sensor of the embodiment. FIG. 3(a) is a plan view illustrating an essential part of the pixel 27. FIG. 3(b) and FIG. 3(c) illustrate a cross-section taken along the lines I-I and II-II respectively indicated in FIG. 3(a). The pixel 27 is formed on a semiconductor substrate P-sub such as silicon substrate. The pixel 27 includes a photogate 1st and 2nd transfer gates $TX_1$ and $TX_2$ and 1st and 2nd discard gates $TX_{BCD}$. The photogate PG senses the incident radiation $L_R$ and generates electric charge. The photogate PG is connected to 1st and 2nd floating semiconductor areas $FD_1$ and $FD_2$ via the 1st and 2nd transfer gates TX1 and TX2. The photogate PG is also connected to 1st and 2nd semiconductor areas $FD_{BCD}$ via the 1st and 2nd discard gates $TX_{BCD}$ respectively. The 1st and 2nd semiconductor areas $FD_{BCD}$ are connected to charge discard line, for example, $V_{DD}$. The photogate PG is provided between the 1st and 2nd transfer gates TX1 and TX2 as well as between the 1st and 2nd discard gates $TX_{BCD}$. The 1st and 2nd floating semiconductor areas $FD_1$ and $FD_2$ and the 1st and 2nd semiconductor areas $FD_{BCD}$ are n-type semiconductor areas formed in, for example, p-type semiconductor areas p-well and p-epi. The 1st and 2nd floating semiconductor areas $FD_1$ and $FD_2$ are connected to the 1st and 2nd n-type semiconductor areas FDR via reset gates Reset, and these semiconductor areas FDR are applied with a reset voltage. The reset gate Reset has a thin MIS (preferably, MOS) structure, and between the reset gate Reset and the p-type semiconductor area p-well, a gate insulation film is provided made of, for example, a thin $SiO_2$. The photogate PG, the 1st and 2nd transfer gates TX1 and TX2 and the 1st and 2nd discard gates $TX_{BCD}$ have a thick MIS (preferably, MOS) structure, between the photogate PG and the 1st and 2nd transfer gates TX1 and TX2 as well as between the 1st and 2nd discard gates $TX_{BCD}$ and n-type semiconductor embedded area n-buried, a gate insulation film is provided made of, for example, a thin $SiO_2$. The 1st and 2nd floating semiconductor areas $FD_1$ and $FD_2$ and the 1st and 2nd floating semiconductor areas $FD_{BCD}$ are in contact with the edge of the n-type semiconductor embedded area n-buried.

The pixel 27 includes amplifiers Amp1 and Amp2 connected to the 1st and 2nd floating semiconductor areas $FD_1$ and $FD_2$, respectively. Each of the amplifiers Amp1 and Amp2 includes a source follower amplifier. For example, each of the amplifiers Amp1 and Amp2 includes an amplifier transistor, and the gates of these transistors are connected to the 1st and 2nd floating semiconductor areas $FD_1$ and $FD_2$ respectively. The source of the amplifier transistor is connected to a column line of the pixel array 23. The conduction of the amplifier transistor is made by a selection transistor. The selection transistor and the amplifier transistor are connected across a power source line and the column line, and the selection transistor is connected to the amplifier transistor in series.

Referring to FIG. 4 and FIGS. 5(a) to 5(f), the operation of the pixel will be described. A typical frame Frame is shown. An imaging window A has the start time prescribed from the start point of the frame Frame and has a predetermined period $T_0$, and also an imaging window B has the start time prescribed from the end point of the imaging window A, and has a predetermined period $T_0$. The frame Frame includes a charge discarding window C different from the imaging windows A and B. Before starting the measurement of distance, the 1st and 2nd floating semiconductor areas $FD_1$ and $FD_2$ of the pixel array are reset.

In the 1st and 2nd imaging windows A and B, the transfer gates TX1 and TX2 are turned on, respectively. The width of the 1st imaging window A is identical to that of the 2nd imaging window B. For the convenience of description of the operation, it is assumed that the radiation pulse $P_T$ is emitted in sync with the rising of the 1st imaging window. The pixel array receives a received pulse $P_R$, which is delayed by a delay time (TOF) corresponding to the distance between the distance image sensor and the object. The photogate PG generates electric charge responding to the received pulse $P_R$. The electric charge is transferred to the 1st and 2nd floating semiconductor areas $FD_1$ and $FD_2$ respectively in the 1st and 2nd imaging windows A and B. As apparent from FIGS. 5(a) to 5(f), the delay time of the pulse PR is identical to the reciprocating time of the light between the distance image sensor and the object.

Figure 5:
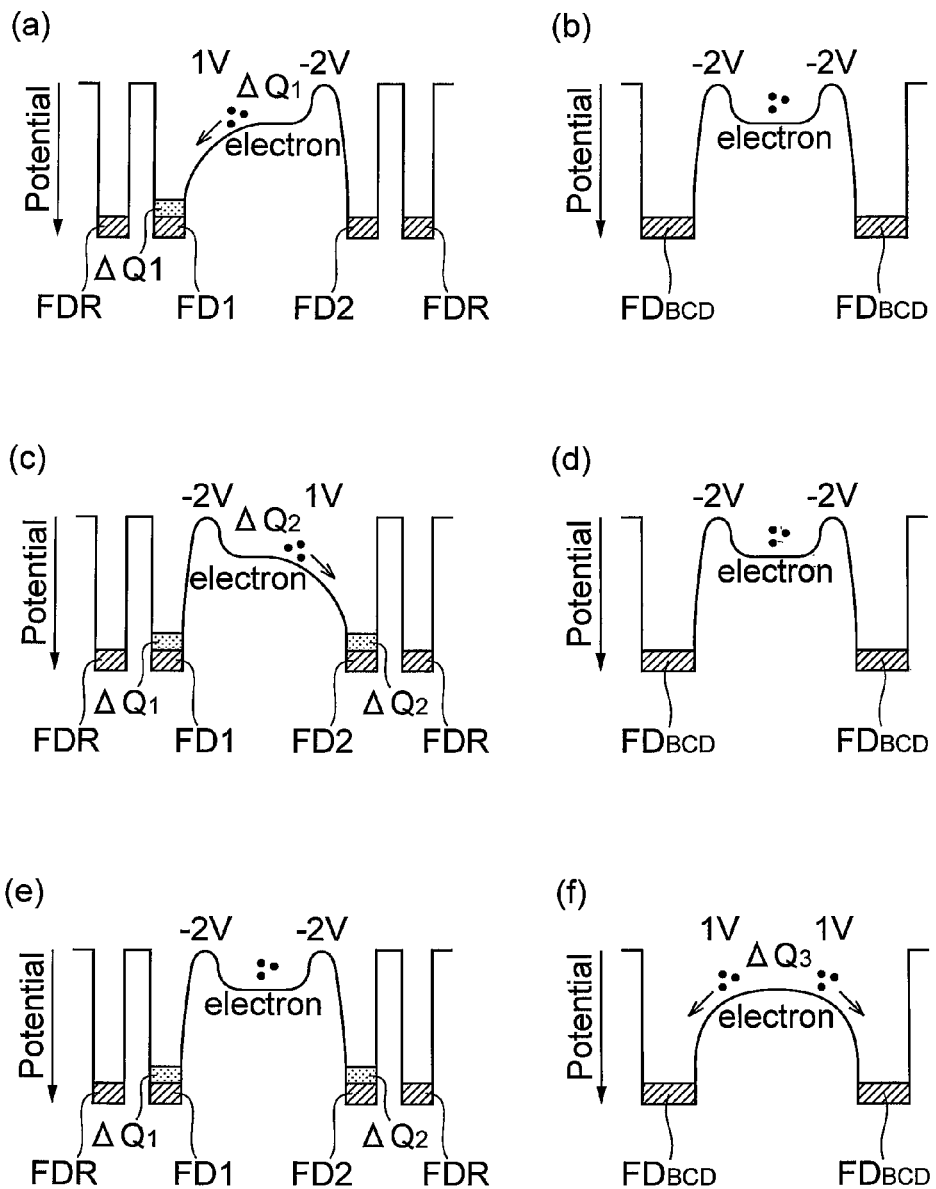
FIGS. 5(a) to 5(f) are diagrams schematically illustrating the operation of the pixel.

As shown in FIG. 5(a), responding to the turn-on of the 1st transfer gate TX1, an electric charge ΔQ1 generated in the 1st imaging window A is transferred to the 1st floating semiconductor area FD1 via the 1st transfer gate TX1. In the 1st imaging window A, the discard gate $TX_{BCD}$ is not turned on as illustrated in FIG. 5(b).

Responding to the turn-on of the 2nd transfer gate TX2, an electric charge ΔQ2 generated in the 2nd imaging window B is transferred to the 2nd floating semiconductor area FD2 via the 2nd transfer gate TX2 as illustrated in FIG. 5(c). The discard gate $TX_{BCD}$ is not turned on in the 2nd imaging window B as illustrated in FIG. 5(d).

Responding to the turn-on of the discard gate $TX_{BCD}$, an electric charge (background charge) ΔQ3 generated in the charge discarding window C is transferred to the semiconductor area $FD_{BCD}$ via the discard gate $TX_{BCD}$ as illustrated in FIG. 5(e). In the charge discarding window C, the 1st and 2nd transfer gates TX1 and TX2 are not turned on as illustrated in FIG. 5(f).

Figure 6:
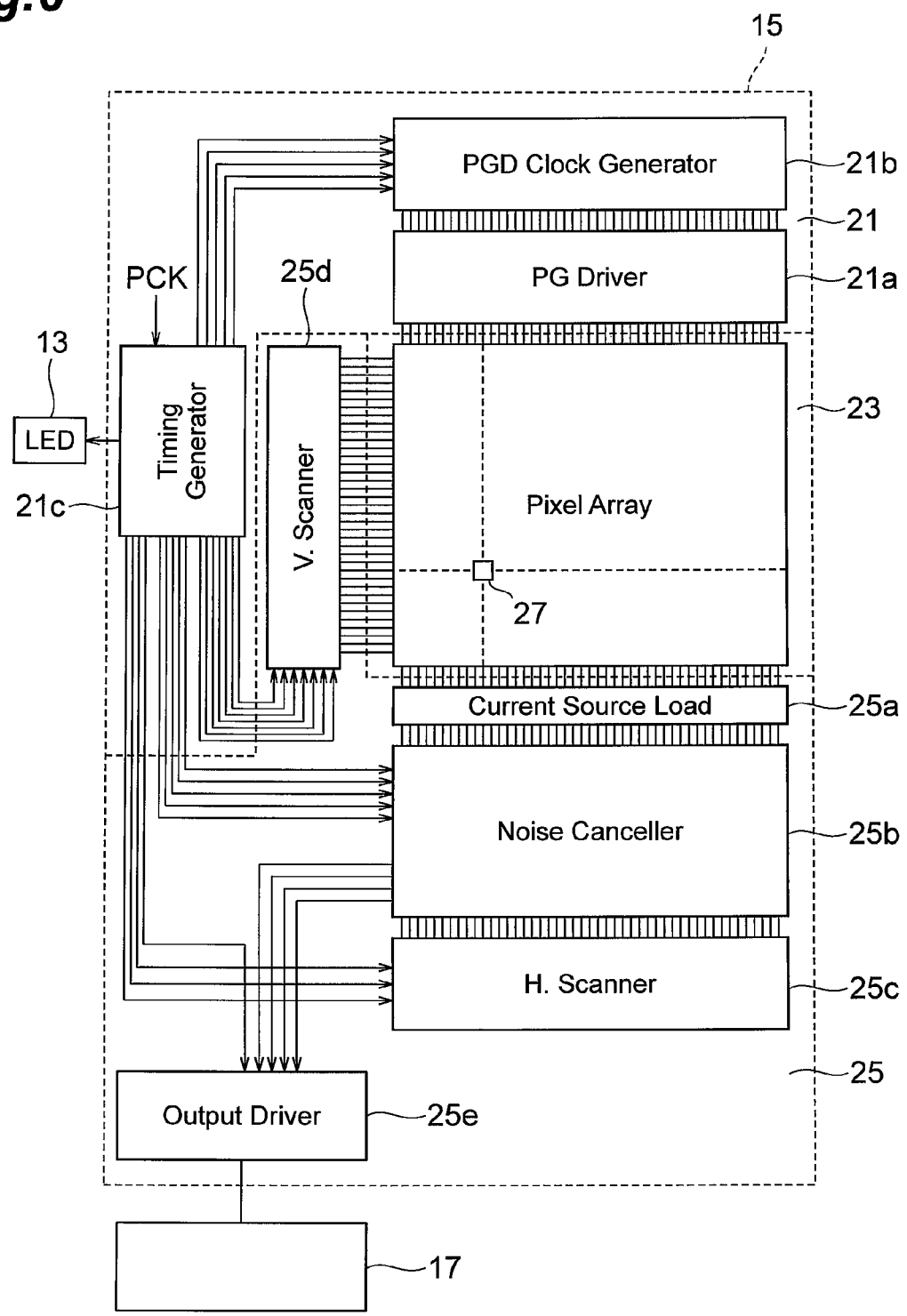
FIG. 6 is a diagram representing the configuration of an image generating unit.

FIG. 6 illustrates the configuration of the image generating unit. The control of the pixel operation, as described referring to FIG. 4 and FIGS. 5(a) to 5(f), is carried out by each circuit of the image generating unit in FIG. 6. FIG. 6 illustrates the pixel array 23. The pixel array 23 has a PG driver 21a provided at one side thereof. The PG driver 21a is connected to the photogate PG of each of the pixels 27 to drive each pixel 27. A PGD clock generator 21b is connected to the PG driver 21a and generates timing clock for the PG driver 21a. The PGD clock generator 21b, being connected to a timing generator 21c, generates clock prescribing operation timing of the image generating unit 15. Responding to the control signals from a vertical scanner 25d, the signal generator 25 reads signals generated by the pixel array 23 in order. The signals are converted into voltage signals on the column line by using a current source 25a, which is a load of a source follower type amplifier of the pixel 27. The voltage signals are processed by a noise cancel circuit 25b and stored in a memory circuit within the noise cancel circuit 25b. Reset noises are removed from the pixel by the processing in the noise cancel circuit 25b. Responding to the control signal from the horizontal scanner 25c, the data of the memory circuit in the noise cancel circuit 25b is transferred to an output drive circuit 25e in order. The output drive circuit 25e provides the 1st to n-th element image signals $S_{E1}$ to $S_{En}$. The processing unit 17 combines n element image signals $S_{E1}$ to $S_{En}$ to generate the image signal $S_{IMAGE}$ which includes distance information concerning the object.

FIGS. 7(a) and 7(b) illustrate pixel distribution characteristics. The distribution characteristics are measured at the timing shown in FIG. 7(a). In one frame, the timings for the 1st and 2nd imaging windows A and B are prescribed. The width of the 1st and 2nd imaging windows A and B is, for example, 100 nanoseconds (ns). The delay time is adjusted by modifying the output timing of the radiation pulse with respect to the imaging time which is prescribed by the 1st and 2nd imaging windows A and B. The width of the radiation pulse is, for example, 100 nanoseconds. Referring to FIG. 7(b), the signals V1, V2 of the output signals for the pixel change substantially lineally with respect to the delay time. The signals V1−V2 also change substantially lineally. Since signal V1+V2 is generally constant in a period width of the imaging window, the electric charge is distributed properly based on the delay time. Since the output value is zero excepting the overlap periods of the 1st and 2nd imaging windows A and B and the radiation pulses, the operation of the charge discarding gate is confirmed. Referring to FIG. 7(b), the signal V1 changes nonlinearly adjacent to the delay time Td=−100 ns and +100 ns, and the signal V2 changes nonlinearly adjacent to the delay time Td=0 ns and +200 ns. It is conceivable that the nonlinear changes are caused by the radiation pulse which is deformed from ideal rectangular.

FIGS. 8(a) and 8(b) illustrate pixel distribution characteristics in which short pulses are used. The measurement of the distribution characteristics is carried out at the timing indicated in FIG. 8(a). The timings of the 1st and 2nd imaging windows A and B are prescribed in one frame. The width of the 1st and 2nd imaging windows A and B is, for example, 100 nanoseconds (ns). The delay time is adjusted by modifying the output timing of the radiation pulses with respect to the imaging time which is prescribed by the 1st and 2nd imaging windows A and B. The width of the radiation pulse is smaller than the width of the 1st and 2nd imaging windows A and B, for example, 10 nanoseconds. The delay time is measured from a point of reference when the falling of the projection pulse coincides with the imaging time of the 1st and 2nd imaging windows A and B. Referring to FIG. 8(*b*), each of the output signals V1 and V2 of the pixel changes substantially linearly with respect to the delay time. The signal V1−V2 also changes substantially linearly. Since the signal V1+V2 is substantially constant in the period width of the imaging windows, the electric charge is distributed corresponding to the delay time. Since the output value is zero excepting a period when the 1st and 2nd imaging windows A and B and the radiation pulse overlap with each other, the operation of the charge discarding gate can be confirmed.

FIGS. 9(*a*) and 9(*b*) show diagrams representing the relationship between the radiation pulse width and the width of the imaging windows, and distance resolution. FIG. 9(*a*) represents a relationship between the intensity of radiation pulse and the distance resolution in a distance measurement performed every 30 frames per second. In the measurement, the width of radiation pulses of 100 ns or 0 ns was used. FIG. 9(*b*) represents a relationship between the intensity of radiation pulse and the distance resolution in a distance measurement performed every 3 frames per second. In the measurement, the width of radiation pulses of 100 ns or 0 ns was used.

Firstly, the distance resolution is enhanced as the intensity of the radiation pulse is increased. When the width of the radiation pulse is changed from 100 ns to 10 ns, the distance resolution decreases to 1/10. Therefore, the distance resolution changes in proportion to the radiation pulse width; therefore, the distance resolution changes linearly with respect to the radiation pulse width from the radiation source as well as decreasing along with the radiation pulse width.

Followings are the resolution values which were obtained from the experiments conducted by the inventor.

Measuring method: radiation pulse 100 ns, radiation pulse 10 ns 30 frames per sec. 29 mm: 2.3 mm (without averaging process) 3 frames per sec., 9.1 mm, 1.3 mm, (with averaging process)

Embodiment 1

Figure 10:
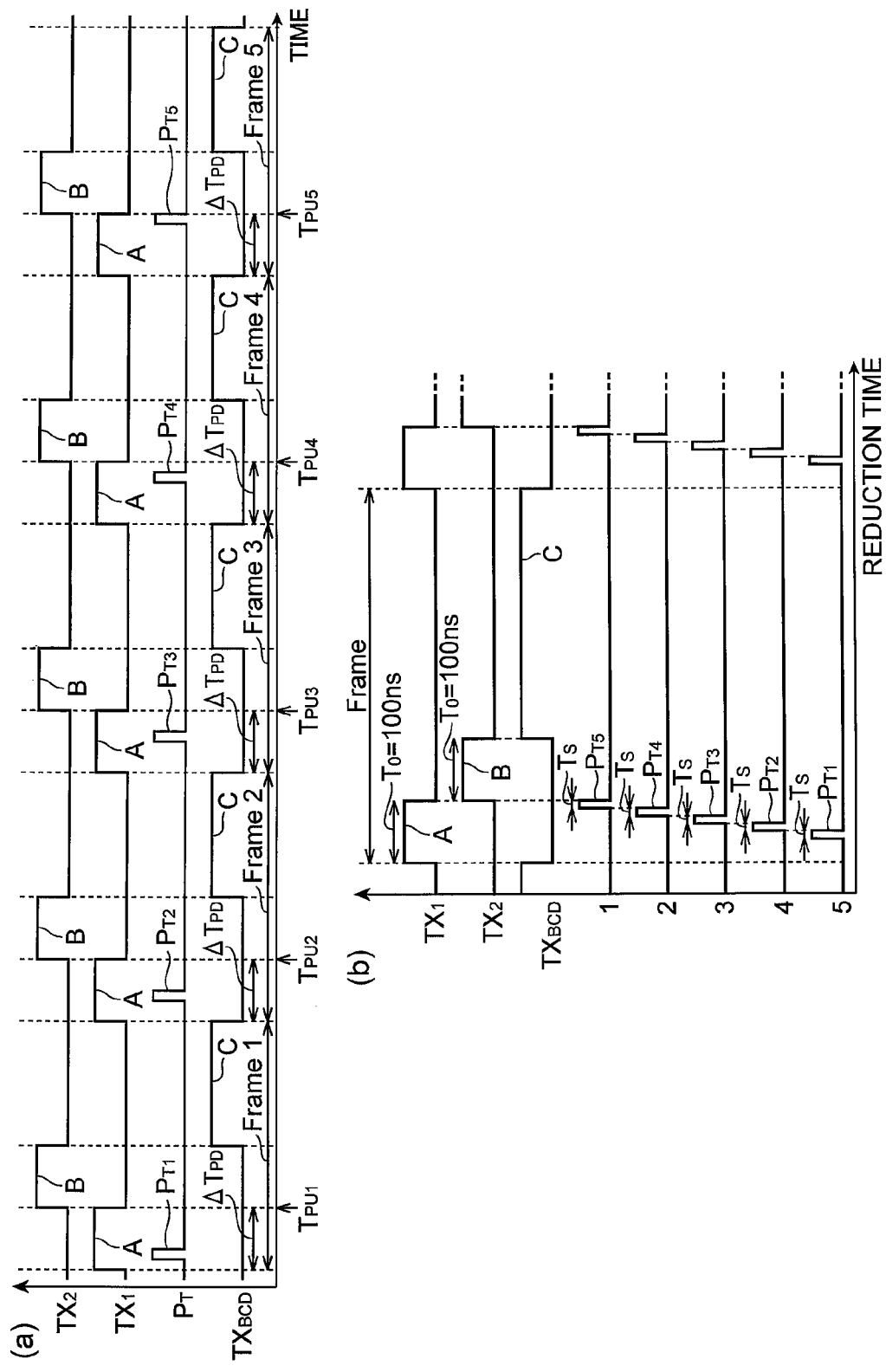
FIGS. 10(a) and 10(b) are diagrams representing distance measurement timing of one embodiment.

FIGS. 10(*a*) and 10(*b*) are diagrams representing an example of a measurement timing. Referring to FIG. 10(*a*), the radiation source 13 provides 1st to n-th pulse trains (5 pulses in FIGS. 10(*a*) and 10(*b*)) $P_{T1}$ to $P_{T5}$, which is irradiated as radiation pulses to an object in each of the 1st to n-th frames (5 frames in FIGS. 10(*a*) and 10(*b*)) arranged in order with respect to a time axis. The 1st to n-th frames are prescribed by control signals. In each frame, each of the imaging times $T_{PU1}$ to $T_{PU5}$ is prescribed at a position of a predetermined time $\Delta T_{PD}$ from the start point of the frame. Each frame includes the imaging windows A and B. The width of the pulses $P_{T1}$ to $P_{T5}$ is smaller than the width of the 1st and 2nd imaging windows. Alternatively, the width of the pulses $P_{T1}$ to $P_{T5}$ may be not more than the width of the 1st and 2nd imaging windows. FIG. 10(*b*) shows the start points of the five frames which are arranged in order with respect to a time axis as origin which are the start point of the respective frames (hereinafter, referred to as "reduced time axis"). FIG. 10(*b*) illustrates that the 1st to n-th pulses $P_{T1}$ to $P_{T5}$ are shifted respectively by shift amounts different from each other, from the start point of the 1st to 5-th frames.

According to the distance image sensor, for measurement of 1st to n-th times-of-flight TOF1 to TOF5, 1st to n-th pulses $P_{T1}$ to $P_{T5}$, which are shifted by shift amounts different from each other, are used. The 1st to n-th pulses $P_{T1}$ to $P_{T5}$ are irradiated to the object from the 1st to n-th frames Frame 1 to Frame 5 which are arranged in order with respect to the time axis. By associating the 1st to n-th pulses $P_{T1}$ to $P_{T5}$ with the 1st and 2nd imaging windows A and B in the 1st to n-th frames Frame 1 to Frame 5 respectively, the times-of-flight TOF1 to TOF5 can be measured plural times.

Each of the 1st to n-th frames Frame 1 to Frame 5 includes a charge discarding window C different from the imaging windows A and B. In the pixel 27, since the electric charge on the detection element is discarded through the charge discarding window C, background noises entering the detection element can be removed. Also, the period of the charge discarding window C is used for reading the output signals S1 and S2 which are generated by the pixels in the imaging windows A and B.

Figure 11:
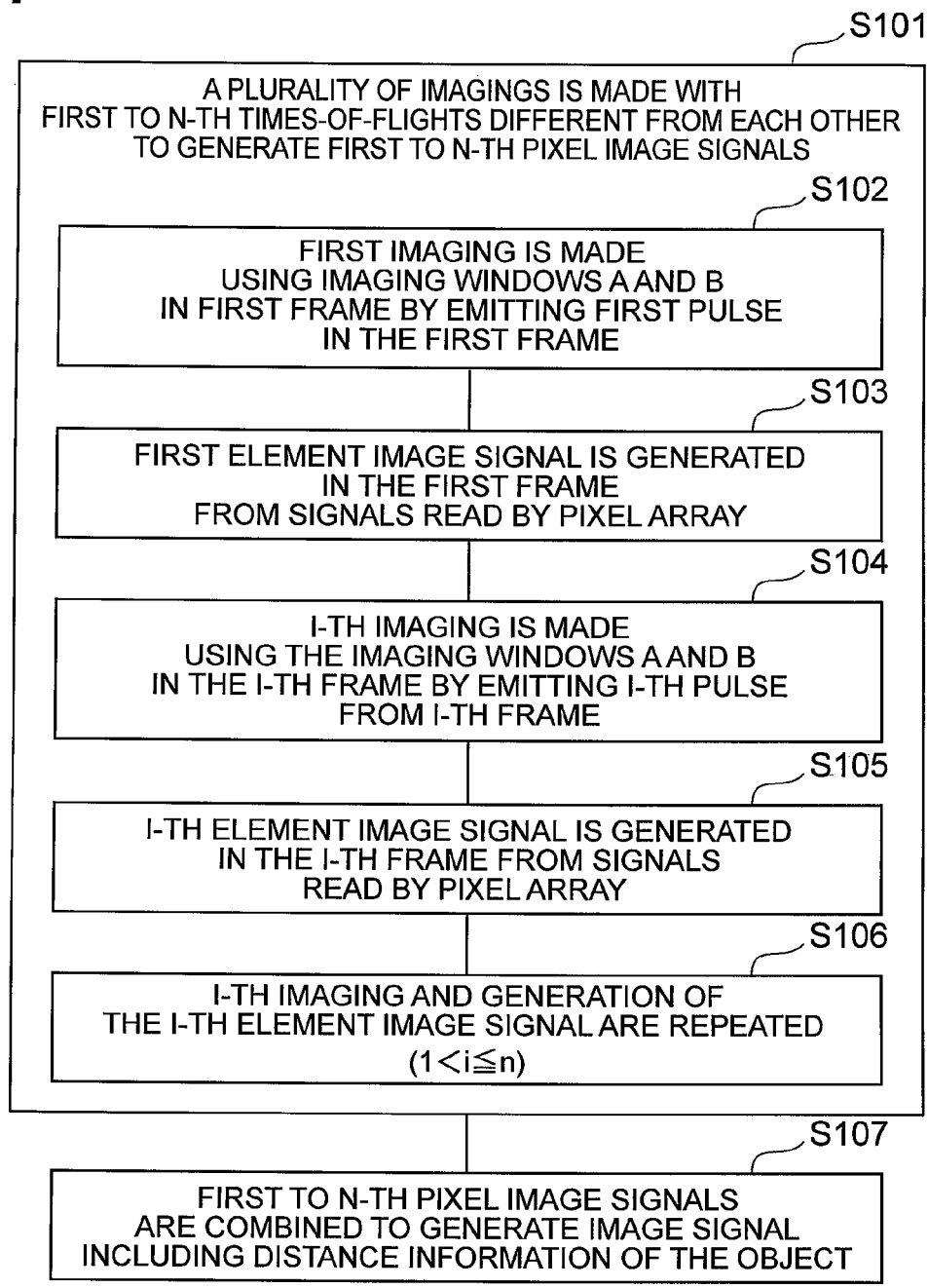
FIG. 11 is a flowchart representing major steps of a method for generating image signals which include distance information concerning an object, using a pixel array and a radiation source by time-of-flight method.

FIG. 11 is a flowchart representing major steps in the method of generating an image signal $S_{IMAGE}$ by time-of-flight method using the pixel array 23 and the radiation source 13. In step S101, using the detection element of the pixel array 23, 1st to n-th imagings are carried out at the 1st to n-th times-of-flight TOF1 to TOFn different from each other to generate 1st to n-th element image signals $S_{E1}$ to $S_{En}$. In step S107, the 1st to n-th element image signals $S_{E1}$ to $S_{En}$ are combined to generate an image signal $S_{IMAGE}$ including distance information concerning the object.

Particularly, step S101 includes the following steps. In step S102, 1st imaging is made using the imaging windows A and B in the 1st frame by emitting a 1st pulse in the 1st frame among the 1st to n-th frames which are arranged in order with respect to the time axis. In step S103, a 1st element image signal $S_{E1}$ is generated by reading the 1st image obtained in step S102 from the pixel array. In step S104, in an i-th frame among the 2nd to n-th frames arranged in order with respect to the time axis, an i-th pulse is emitted to carry out i-th imaging by using the imaging windows A and B in the i-th frame. In step S105, the i-th image obtained in step S104 is read from the pixel array to generate an i-th element image signal $S_{Ei}$. In step S106, the i-th imaging and generation of the i-th element image signal $S_{Ei}$ are repeated.

As described above, for measurement of 1st to n-th times-of-flight TOF1 to TOFn, the 1st to n-th pulses, which are shifted by shift amounts different from each other, are used. These pulses are irradiated to the object respectively in the 1st to n-th frames arranged in order with respect to the time axis. Plural times of measurement of the times-of-flight TOF1 to TOFn can be made by associating each of the 1st to n-th pulses with the 1st and 2nd imaging windows respectively in the 1st to n-th frames.

According to this method, since the 1st to n-th times-of-flight TOF1 to TOFn are different from each other, each of the times-of-flight covers distance measuring ranges different from each other. Also, since the element image signals $S_{E1}$ to $S_{En}$ are generated at n imaging timings corresponding to the times-of-flight TOF1 to TOFn, each of the element image signals $S_{E1}$ to $S_{En}$ has distance information of the object in distance ranges different from each other. Since the image signal $S_{IMAGE}$ is generated by combining these element image signals $S_{E1}$ to $S_{En}$, the distance information of the object can be obtained in a wide distance range. Also, in order to obtain the distance information of the object, at each imaging timing, 1st and 2nd signals S1 and S2 responding to the incident radiation entering the detection element of the pixel are generated in the imaging windows A and B, and by plural times of time-of-flight measurement, the distance range information concerning the object is obtained in desired distance range. Therefore, the width of the radiation pulses does not have to be increased to obtain distance information of an object in a wide distance range. Accordingly, the distance resolution is not reduced in each time-of-flight measurement.

Embodiment 2

In a distance image sensor of Embodiment 2, the radiation source 13 provides a single pulse $P_{T0}$ as a radiation pulse to a single frame Frame 0. FIG. 12(a) represents timings in which single frame is used. The frame is prescribed by control signals. The 1st to n-th imaging timings in the 1st to n-th frames (in this example, $T_{PU1}$, $T_{PU2}$, and $T_{PU3}$) are set within the single frame Frame 0. The imaging times $T_{PU1}$, $T_{PU2}$ and $T_{PU3}$ of the imaging timings are shifted from the start point of the single frame Frame 0 by shift amounts different from each other. Between the i-th imaging timing ($1 \leq i < n-1$) and the i+1-th imaging timing among n imaging timings, a window corresponding to the incident radiation entering the detection element is prescribed for taking electric charge to the floating semiconductor area. Immediately before each of the imaging times $T_{PU1}$, $T_{PU2}$ and $T_{PU3}$, the imaging window A is provided; and immediately after each of the imaging times, the imaging window B is provided. Therefore, the windows between these imaging windows are used as common imaging windows A and B.

According to the distance image sensor, the imaging windows A and B are arranged alternately to constitute a row of the imaging windows. At the top of the row of the imaging windows, a single pickup window A is set; and at the last thereof, a single imaging window B is set. In the row of the imaging windows, one or a plurality of common imaging windows are set between the 1st single imaging window and the 2nd single imaging window. The common imaging windows are provided for both of the 1st imaging window and the 2nd imaging window. Therefore, before and after the imaging time in each of the 1st to n-th imaging timings, 1st and 2nd imaging windows are provided. At the plurality of imaging times in the row of the imaging windows, a plurality of element image signals is generated.

In one example, the duration of the single pulse $P_{T0}$ is equal to that of the 1st imaging window A; and the duration of the single pulse $P_{T0}$ is equal to the period of the 2nd imaging window B. The duration of the single pulse $P_{T0}$ is prescribed from the start point of the frame Frame 0. From the end point of the single pulse $P_{T0}$, a row of a predetermined number of windows is prescribed. Windows within a window row are prescribed by the turn-on of the transfer gates TXi different from each other. The single frame Frame 0 includes a charge discarding window with a period different from the period of the row of the windows. The pixel 27 discards the electric charge of the detection element through the charge discarding window. With this arrangement, background noises affecting the detection element are removed.

Figure 13:
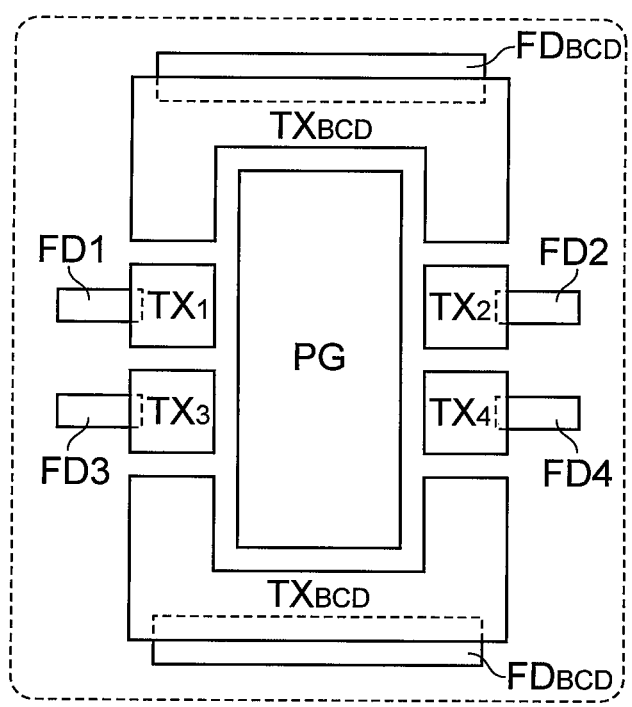
FIG. 13 is a plan view representing a structure of a pixel applicable to the embodiment.

FIG. 13 is a plan view illustrating a structure of a pixel applicable to this embodiment. Comparing the pixel in FIG. 13 to that in FIG. 3(a), the structure of the pixel in FIG. 13 is identical to that of the pixel in FIG. 3(a) excepting the structure of the transfer gate. The pixel in FIG. 13 includes the 1st to j-th transfer gates (TX1 and TX3 in FIG. 13) in a first group, which are disposed at the one side of the photogate PG and the (j+1)-th to (n+1)-th transfer gates (TX2 and TX4 in FIG. 13) in a second group, which are disposed at the other side of the photogate PG. The 1st to (n+1)-th transfer gates (TX1 to TX4 in FIG. 13) are turned on at any of the 1st to n-th imaging timings. Each of the 1st to (n+1)-th transfer gates (TX1 to TX4 in FIG. 13) is connected to one of the 1st to (n+1)-th floating semiconductor areas (FD1 to FD4 in FIG. 13). The photogate PG is located between the discard gates $TX_{BCD}$.

FIG. 12(b) represents the signals which are generated by the selection gates TX1 to TX4 responding to the delay of pulse. The reference of the delay time is prescribed by the rising time of the radiation pulse. The selection gates TX1 to TX4 take in a pulse delayed due to times-of-flight and generates signals $V_{TX1}$, $V_{TX2}$, $V_{TX3}$ and $V_{TX4}$ shown in FIG. 12(b). FIG. 12(b) illustrates that the transfer gates TX1 to TX4 generate signals different from each other responding to the delay time. FIG. 12(b) illustrates characteristics corresponding to those in FIG. 7(b) and FIG. 8(b). Although one single pulse $T_{P0}$ is used, but the time-of-flight measurement can be made plural times by using three or more rows of the imaging windows. During the imaging period, one of the transfer gates TX1 to TX4 is turned on.

Figure 14:
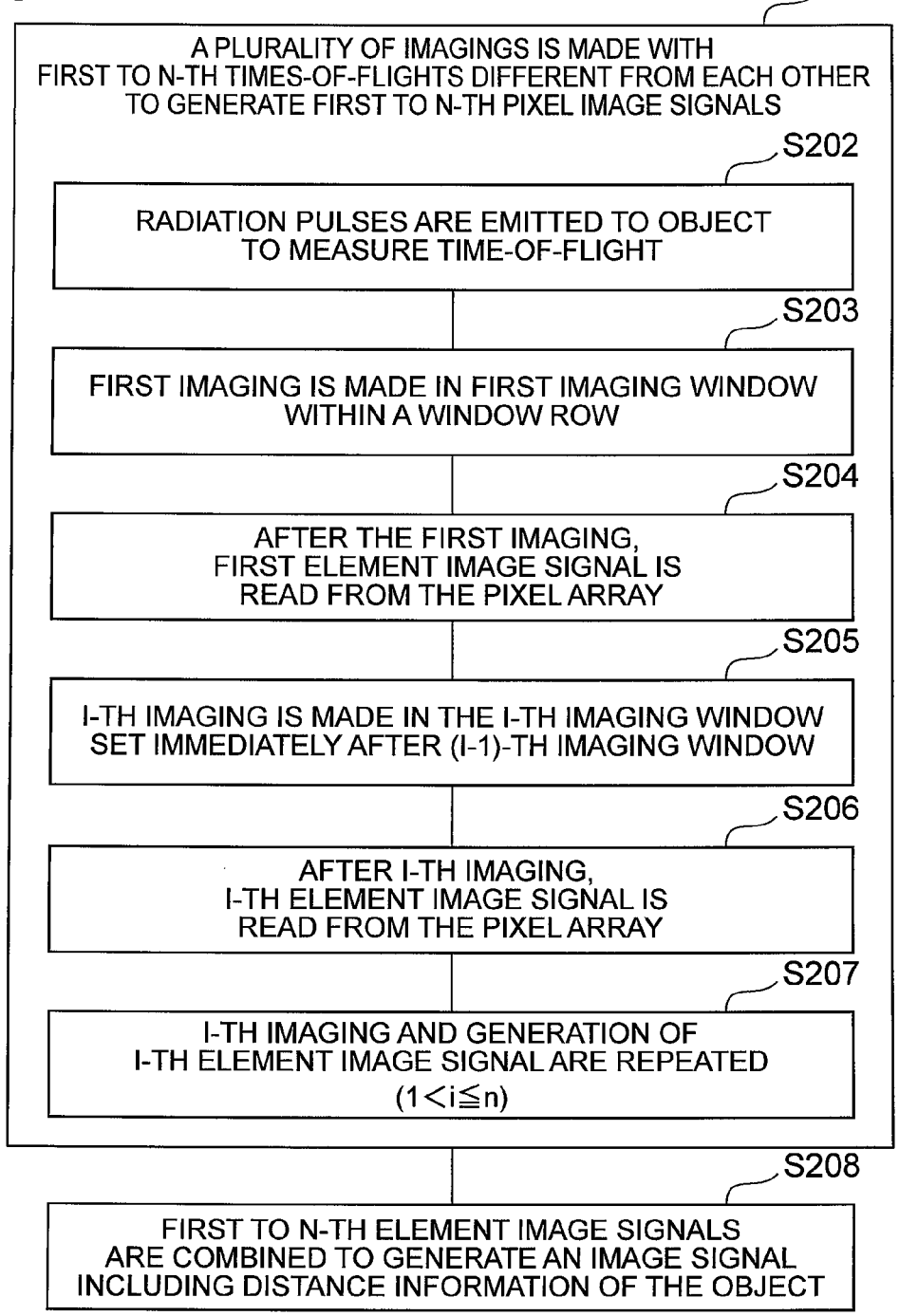
FIG. 14 is a flowchart representing major steps in a method of generating image signals, which include distance information concerning an object, by time-of-flight method using a pixel array including a plurality of pixels, and a radiation source for measuring time-of-flight.

FIG. 14 is a flowchart representing major steps in the method of generating an image signal $S_{IMAGE}$ by time-of-flight method using the pixel array 23 and the radiation source 13. In step S201, n-times of imaging is made by times-of-flight TOF1 to TOFn, which are different from each other, using the detection element of the pixel array 23 to generate element image signals $S_{E1}$ to $S_{En}$. In step S208, element image signals $S_{E1}$ to $S_{En}$ are combined to generate an image signal $S_{IMAGE}$.

In particular, step S201 includes the following steps. In step S202, radiation pulses are irradiated to the object to measure the time-of-flight. In step S203, 1st imaging is made in the 1st imaging window within the plurality of window rows. In step S204, the 1st image obtained in step S203 is read from the pixel array to generate a 1st element image signal $S_{E1}$. In step S205, i-th imaging is made in the i-th imaging window immediately after the (i−1)-th window. In step S206, the i-th image obtained in step S205 is read from the pixel array to generate a 1st element image signal $S_{Ei}$. In step S207, the i-th imaging and the generation of i-th element image signal $S_{Ei}$ are repeated.

As described above, the imaging is made plural times using a single radiation pulse and three or more imaging windows. According to this method, since the times-of-flight TOF1 to TOFn are different from each other, different measurement ranges are covered by the different times-of-flight. Also, since the element image signals $S_{E1}$ to $S_{En}$ are generated at n-times of imaging timings corresponding to the times-of-flight TOF1 to TOFn, each of the element image signals $S_{E1}$ to $S_{En}$ has different distance information of the object in distance ranges different from each other. Since these element image signals $S_{E1}$ to $S_{En}$ are combined to generate the image signal $S_{IMAGE}$, distance information of the object can be obtained in a wide distance range. Also, in order to obtain distance information of the object, since the 1st and 2nd output signals S1 and S2, which correspond to the incident radiation entering the detection element of the pixel, are generated by the imaging window A and the imaging window B at the 1st to n-th imaging timings, distance range information concerning the object is obtained in a desired range by plural times of time-of-flight measurement. Accordingly, the width of radiation pulse does not have to be increased to obtain distance information of the object in a wide distance range. Therefore, the distance resolution is not reduced in each time-of-flight measurement.

Several examples of measuring devices will be described below.

Example 1

Range Shift Timing

Referring to FIGS. 15(a) and 15(b), an example of distance image sensor will be described. In this distance image sensor, frames Frame 1 to Frame 4 are disposed along the time axis. Each of the frames. Frame 1 to Frame 4 is provided with imaging windows A and B. Referring to FIG. 15(a), the width of the imaging windows A and B is 100 nanoseconds; the imaging window A is disposed being adjusted to the start point of the frame, and the imaging window B is disposed immediately after the imaging window A. The frames Frame 1 to Frame 4 are provided with pulses $P_{T1}$ to $P_{T4}$ respectively. The width of the pulse $P_T$ for time-of-flight is 25 nanoseconds. The pulse $P_{T1}$ is shifted by a shift amount of 75 nanoseconds from the start point of the frame Frame 1; the pulse $P_{T2}$ is shifted by a shift amount of 50 nanoseconds from the start point of the frame Frame 2; pulse $P_{T3}$ is shifted by a shift amount of 25 nanoseconds from the start point of the frame Frame 3; and the pulse $P_{T4}$ is provided to the start point of the frame Frame 4.

When the pulse $P_T$ of 25 nanosecond width is used, the measurement range is 3.75 m. When the frame Frame 1 is used, a range of 3.75 m from the sensor can be measured; when the frame Frame 2 is used, a range of from 3.75 m to 7.5 m can be measured; when the frame Frame 3 is used, a range of from 7.5 m to 11.25 m can be measured; and when the frame Frame 4 is used, a range of from 11.25 m to 15 m can be measured. When four pulses are used, the measurement range is 15 m that is the same as the measurement range using a pulse width of 100 nanoseconds. On the other hand, according to the distance image sensor, since the pulse width can be reduced, compared to the distance measurement using the pulse width of 100 nanoseconds, the distance resolution is enhanced.

The inventor estimated the resolution in the distance measurement as shown in FIG. 15(b). When the width of the pulse $P_T$ is 100 nanoseconds (comparative example), and when electron ($N_B$) generated by photogate responding to background light was $10^4$, $10^5$, the distance resolution $\sigma_L$ is 0.040 m, 0.045 m respectively. On the other hand, in this example, when the width of the pulse $P_T$ was 25 nanoseconds, and electron ($N_B$) generated by the photogate responding to background light was $10^4$, $10^5$, the distance resolution $\sigma_1$, was 0.010 m, 0.011 m respectively. By reducing the pulse width, the distance resolution can be reduced.

Example 2

Duty Ratio

Referring to FIG. 16, an example of the distance image sensor will be described. In this distance image sensor, frames Frame 1 to Frame 4 are arranged along the time axis. Each of the frames Frame 1 to Frame 4 is provided with imaging windows A and B. The width of the imaging windows A and B is 25 nanoseconds; the imaging window A is disposed at a time shifted by 75 nanoseconds from the start point of the frame, and the imaging window B is disposed immediately after imaging window A. The frames Frame 1 to Frame 4 are provided with pulses $P_{T1}$ to $P_{T4}$ respectively as same as Example 1.

By reducing the ratio of the width of the imaging window with respect to the width of the frame (duty ratio), influences of noises due to background light during TOF measurement can be reduced. By reducing the influences of noises, the distance resolution is improved. In Example 2, since the width of the imaging window is 25 nanoseconds that is ¼ of the value in Example 1, the background light which is inevitably taken in the imaging window is reduced.

The inventor estimated the resolution in the distance measurement as shown in FIG. 16(b). When electron number ($N_R$) due to random noise on the readout circuit and electron ($N_B$) which is generated by the photogate responding to the background light is 100, $10^5$ respectively, and when the duty ratio of the pulses of the light source is 0.1, the distance resolution of the distance image sensor of the pulse $P_T$ of 100 nanoseconds (comparative example) was estimated. The distance resolution $\sigma_L$ was approximate 4.5 cm or less with respect to the measuring range of 15 m.

Also, when the electron number ($N_R$) due to random noises of the readout circuit and the electron ($N_B$) generated by the photogate responding to the background light are 100, $10^5$ respectively, the distance resolution of the distance image sensor with a pulse $P_T$ of 25 nanoseconds was estimated. When the duty ratio of the light source pulses is 0.1, 0.025 respectively, the distance resolution $\sigma_L$ was approx. 1.1 cm or less, 1 cm or less, respectively, with respect to the distance measurement range of 15 m. By reducing the duty ratio of the light source pulses, the distance resolution is reduced.

Example 3

Linear Response Area

Referring to FIG. 17, an example of the distance image sensor will be described. In this distance image sensor, frames Frame 1 to Frame 7 are arranged along the time axis. The frames Frame 1 to Frame 7 are provided with imaging windows A and B.

The width of the imaging windows A and B is 100 nanoseconds; the imaging window A is disposed being aligned with the start point of the frame; and the imaging window B is disposed immediately after the imaging window A. The frames Frame 1 to Frame 7 are provided with pulses $P_{T1}$ to $P_{T7}$ as same as Example 1. The width of the imaging windows A and B is 100 nanoseconds, and the width of pulses $P_{T1}$ to $P_{T7}$ for time-of-flight is 25 nanoseconds.

As shown in FIG. 17(b), the delay time of the signals from the pixel displaced from the linear change with respect to the delay time near 0 second and 10 nanoseconds. This non-linearity reduces the distance accuracy. By using a linear response area of the delay time for the distance measurement, the distance accuracy can be maintained to a predetermined value. By adjusting the width and the shift amount of the pulses $P_{T1}$ to $P_{T7}$, the distance can be determined based on the relationship between the delay time and the distance using linear area of each of the pulses $P_{T1}$ to $P_{T7}$.

In the frame Frame 1, the pulse $P_{T1}$ is provided crossing the changing time between the imaging window A and the imaging window B. The falling of the pulse $P_{T2}$ is shifted by +3 nanoseconds from the time as reference. In the frame Frame 2, the pulse $P_{T2}$ is shifted by a shift amount of −4 nanoseconds with respect to the shift amount of the pulse $P_{T1}$. In the frame Frame 3, the pulse $P_{T3}$ is shifted by a shift amount of −4 nanoseconds with respect to the shift amount of the pulse $P_{T2}$. Likewise, the pulses $P_{T4}$ to $P_{T7}$ are also shifted by a predetermined adjustment amount (−4 nanoseconds) with respect to the shift amount of the pulses $P_{T3}$ to $P_{T6}$ in the neighboring frames as reference. Therefore, the difference between the shift amount of the radiation pulse in a frame and the shift amount of the radiation pulse in the neighboring frame is smaller than the width of the radiation pulse.

According to the distance image sensor, since the linear response area is used, distance accuracy is ensured in entire time-of-flight measurement range.

The principles of the invention has been illustrated and described along with preferable embodiments. It is recognizable for a person skilled in the art that the invention may be modified in arrangement and detail thereof without deviating from the principles. The invention is not limited to any certain configurations disclosed in the embodiments. Any modifications or changes originated from the range of claims and spirit thereof are therefore included in claims.

INDUSTRIAL APPLICABILITY

As described above, embodiments of the invention relate to TOF distance image sensor and method based on range shift operation, and are constituted as described below. Using small duty ratio, i.e. short period pulsed light, and during the period other than the period for detecting imaging windows, generated electric charge is discarded without being accumulated. Based on such structure, the imaging is made plural times while shifting the relative relationship between the emitting radiation timing of the light pulse and the imaging windows to generate a plurality of element image signals. By combining these element image signals, a desired distance resolution is ensured and the distance measurement range can be increased. Also, in the method and device of the embodiments of the invention, the distance image sensor having the structure for discarding electric charge carries out the imaging while shifting the relative relationship between the emitting timing of short-period light pulse and the imaging windows for the imaging. The images are combined and used for distance measurement. With this, while maintaining high distance resolution, a wide distance measurement range is ensured. Further, the distance image sensor and method according to the embodiment read the signals from the pixel at every timing of a plurality of imaging timings by using prescribed imaging windows. With this arrangement, as the signals within one frame, a plurality of element image signals, the ranges of which are shifted by a different value from each other, are read out. Furthermore, when distance measurement pulses with a small pulse width are used with one distance measurement pulse, the range detected linearly becomes smaller. In order to avoid the reduction in the distance accuracy, the distance image sensor and method according to the embodiment use a plurality of distance measurement ranges which are shifted so as to have shift amounts different from each other and carry out the measurement of the distance using distance measurement pulses which are arranged so that the distance measurement ranges are overlapped with each other. Distance measurement ranges different from each other are allotted to each distance measurement using the pulses, and the pulses are adjusted so that the difference of the shift amount among the distance measurement pulses is smaller than the pulse width of the distance measurement pulses. With this arrangement, the measurement can be made linearly in a wide measurement range.

REFERENCE SIGNS LIST

11 . . . distance image sensor, 13 . . . radiation source, 15 . . . image generating unit, 17 . . . processing unit, 13a . . . semiconductor light-emitting element, 13b . . . drive circuit, 21 . . . controller, 23 . . . pixel array, 25 . . . signal generator, 27 . . . pixel, $S_{E1}$ to $S_{En}$ . . . element image signal, $S_{IMAGE}$ . . . image signal, $W_{PU1}$, $W_{PU2}$ . . . 1st and 2nd imaging windows

The invention claimed is:
1. A distance image sensor using time-of-flight method, comprising:
a radiation source that generates radiation pulses to irradiate an object for measuring time-of-flight;
an image generating unit including a controller that generates control signals indicating 1st to n-th imaging timings corresponding to 1st to n-th times-of-flight (n>1) different from each other, a pixel array of a plurality of pixels including a detection element for sensing incident radiation to generate electric charge, and a signal generator that generates 1st to n-th element image signals corresponding respectively to the 1st to n-th imaging timings responding to the control signals; and
a processing unit that combines the 1st to n-th element image signals to generate an image signal including distance information concerning the object;
wherein the detection element of each pixel generates 1st and 2nd electric charges respectively responding to an incident radiation that enters the detection element in 1st and 2nd imaging windows at each of the 1st to n-th imaging timings;
each pixel provides 1st and 2nd element signals from the 1st and 2nd electric charges corresponding respectively to the 1st and 2nd imaging windows;
the 1st imaging window, set immediately before an imaging time prescribed from a reference time, has a predetermined duration;
the 2nd imaging window, set immediately after the imaging time, has a predetermined duration;
the i-th element image signal ($1 \leq i \leq n$) includes the 1st and 2nd element signals of each pixel at the i-th imaging timing;
the radiation source provides 1st to n-th pulse trains as the radiation pulses to be irradiated to the object in each of the 1st to n-th frames arranged in order with respect to a time axis,
the 1st to n-th pulses are shifted respectively by shift amounts different from each other from the start point of the 1st to n-th frames,
in each of the 1st to n-th frames, the reference time is positioned at the start point of each frame,
each of the 1st to n-th frames includes the 1st and 2nd imaging windows,
the duration in each of the 1st to n-th pulses is smaller than the period of the 1st imaging window, and
the duration in each of the 1st to n-th pulses is smaller than the period of the 2nd imaging window.
2. The distance image sensor according to claim 1, wherein each of the 1st to n-th frames includes the 1st and 2nd imaging windows and a charge discarding window different from the 1st and 2nd imaging windows, and
the pixel discards electric charge of the detection element in the charge discarding window.
3. The distance image sensor according to claim 2, wherein the pixel includes 1st and 2nd transfer gates each of which is turned on in the 1st and 2nd imaging windows at the 1st to n-th imaging timings and connected to the detection element, and 1st and 2nd discard gates which are connected to the detection element and turned on in the charge discarding window,
the detection element is located between the 1st transfer gate and the 2nd transfer gate, and
the detection element is located between the 1st discard gate and the 2nd discard gate.
4. The distance image sensor according to claim 3, wherein the pulse width of the 1st to n-th pulses is prescribed so as to generate an image signal including the distance information using a linear response area.
5. The distance image sensor according to claim 1, wherein the pulse width of the 1st to n-th pulses is prescribed so as to generate an image signal including the distance information using a linear response area.

6. The distance image sensor according to claim 2, wherein the pulse width of the 1st to n-th pulses is prescribed so as to generate an image signal including the distance information using a linear response area.

7. A distance image sensor using time-of-flight method, comprising:
a radiation source that generates radiation pulses to irradiate an object for measuring time-of-flight;
an image generating unit including a controller that generates control signals indicating 1st to n-th imaging timings corresponding to 1st to n-th times-of-flight (n>1) different from each other, a pixel array of a plurality of pixels including a detection element for sensing incident radiation to generate electric charge, and a signal generator that generates 1st to n-th element image signals corresponding respectively to the 1st to n-th imaging timings responding to the control signals; and
a processing unit that combines the 1st to n-th element image signals to generate an image signal including distance information concerning the object,
wherein the detection element of each pixel generates 1st and 2nd electric charges respectively responding to an incident radiation that enters the detection element in 1st and 2nd imaging windows at each of the 1st to n-th imaging timings,
each pixel provides 1st and 2nd element signals from the 1st and 2nd electric charges corresponding respectively to the 1st and 2nd imaging windows,
the 1st imaging window, set immediately before an imaging time prescribed from a reference time, has a predetermined duration,
the 2nd imaging window, set immediately after the imaging time, has a predetermined duration,
the i-th element image signal ($1 \leq i \leq n$) includes the 1st and 2nd element signals of each pixel at the i-th imaging timing
the radiation source provides a single pulse to a single frame as the radiation pulse,
the 1st to n-th imaging timings are set within the frame,
the imaging times of the 1st to n-th imaging timings are shifted from the start point of the single frame by shift amounts different from each other,
the 1st imaging window is provided immediately before the imaging time of the 1st imaging timing,
the 2nd imaging window is provided immediately after the imaging time of the n-th imaging timing,
between the i-th imaging timing ($1 \leq i < n-1$) and the (i+1)-th imaging timing among the 1st to n-th imaging timings, a window for taking in electric charge responding to an incident radiation entering the detection element is prescribed,
the window is used for both of the 1st and 2nd imaging windows,
the duration of the radiation pulse is not more than the period of the 1st imaging window, and
the duration of the radiation pulse is not more than the period of the 2nd imaging window.

8. The distance image sensor according to claim 7, wherein the single frame includes the 1st and 2nd imaging windows and a charge discarding window different from the 1st imaging window and the 2nd imaging window, and
the pixel discards electric charge of the detection element in the charge discarding window.

9. The distance image sensor according to claim 8, wherein the pixel includes 1st to j-th transfer gates in a 1st group disposed at one side of the detection element, (j+1)-th to (n+1)-th transfer gates in a 2nd group disposed at the other side of the detection element, and 1st and 2nd discard gates which are connected to the detection element and turned on in the charge discarding window,
the 1st to (n+1)-th transfer gates are turned on at any of the 1st to n-th imaging timings, and
the detection element is located between the 1st discard gate and the 2nd discard gate.

10. A method for generating image signals including distance information concerning an object by time-of-flight method using a pixel array including a plurality of pixels and a radiation source for measuring time-of-flight, the method comprising the steps of:
generating 1st to n-th element image signals by carrying out a plurality of imagings at 1st to n-th times-of-flight (n>1) different from each other using a detection element of the pixel array; and
generating an image signal including distance information concerning the object by combining the 1st to n-th element image signals,
wherein each pixel generates 1st and 2nd electric charges in 1st and 2nd imaging windows at the 1st to n-th imaging timings, respectively,
the 1st imaging window, set immediately before imaging time prescribed from a reference time, has a predetermined duration, the 2nd imaging window, set immediately after the imaging time, has a predetermined duration,
each pixel provides 1st and 2nd element signals corresponding respectively to the amounts of the 1st and 2nd electric charges,
the i-th element image signal ($1 \leq i \leq n$) includes the 1st and 2nd element signals of the plurality of pixels at the i-th imaging timing,
the step of generating the 1st to n-th element image signals includes the step of irradiating the object with radiation pulses for measuring the time-of-flight,
in the irradiation of the radiation pulses, 1st to n-th pulses for irradiating the object in each of the 1st to n-th frames arranged in order with respect to a time axis are emitted,
the 1st to n-th pulses are shifted respectively by shift amounts different from each other from the start point of the 1st to n-th frames,
in each of the 1st to n-th frames, the reference time is the start point of each of the frames,
each of the 1st to n-th frames includes the 1st and the 2nd imaging windows,
the duration of each of the 1st to n-th pulses is smaller than the period of the 1st imaging window, and
the duration of each of the 1st to n-th pulses is smaller than the period of the 2nd imaging window.

11. A method for generating image signals including distance information concerning an object by time-of-flight method using a pixel array including a plurality of pixels and a radiation source for measuring time-of-flight, the method comprising the steps of:
generating 1st to n-th element image signals by carrying out a plurality of imagings at 1st to n-th times-of-flight (n>1) different from each other using a detection element of the pixel array; and
generating an image signal including distance information concerning the object by combining the 1st to n-th element image signals,
wherein each pixel generates 1st and 2nd electric charges in 1st and 2nd imaging windows at the 1st to n-th imaging timings, respectively, the 1st imaging window, set immediately before imaging time prescribed from a reference time, has a predetermined duration, the 2nd imaging window, set immediately after the imaging time, has a predetermined duration, each pixel provides 1st and 2nd element signals corresponding respectively to the amounts of the 1st and 2nd electric charges, the i-th element image signal ($1 \leq i \leq n$) includes the 1st and 2nd element signals of the plurality of pixels at the i-th imaging timing, the step of generating the 1st to n-th element image signals includes the step of irradiating the object with radiation pulses for measuring the time-of-flight, in the radiation of radiation pulses, a single pulse is emitted to a single frame, the 1st to n-th imaging timings are set within the single frame, each of the 1st and 2nd imaging windows is provided between the neighboring imaging timings among the 1st to n-th imaging timings, the 1st imaging window is provided immediately before the imaging time of the 1st imaging timing, the 2nd imaging window is provided immediately after the imaging time of the n-th imaging timing, between the i-th imaging timing ($1 \leq i < n-1$) and the (i+1)-th imaging timing in the 1st to n-th imaging timings, a window for taking in electric charge responding to an incident radiation entering the detection element is prescribed, the window is used for both of the 1st and 2nd imaging windows, the duration of the pulse is not more than the period of the 1st imaging window, and the duration of each of the pulses is not more than the period of the 2nd imaging window.

12. The method according to claim 11, wherein the duration of each of the radiation pulses is smaller than the period of the 1st imaging window, and the duration of each of the radiation pulses is smaller than the period of the 2nd imaging window.

* * * * *

UNITED STATES PATENT AND TRADEMARK OFFICE
CERTIFICATE OF CORRECTION

PATENT NO.       : 8,537,218 B2
APPLICATION NO. : 13/056697
DATED            : September 17, 2013
INVENTOR(S)      : Shoji Kawahito It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 388 days.

Signed and Sealed this

Fifteenth Day of September, 2015

Michelle K. Lee
*Director of the United States Patent and Trademark Office*